(12) United States Patent
Ouyang

(10) Patent No.: US 12,013,645 B2
(45) Date of Patent: *Jun. 18, 2024

(54) METHOD FOR REMOVING RESIST LAYER, METHOD OF FORMING A PATTERN AND METHOD OF MANUFACTURING A PACKAGE

(71) Applicant: Taiwan Semiconductor Manufacturing Company, Ltd., Hsinchu (TW)

(72) Inventor: Christine Y Ouyang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,048

(22) Filed: Apr. 7, 2022

(65) Prior Publication Data

US 2022/0229369 A1    Jul. 21, 2022

Related U.S. Application Data

(63) Continuation of application No. 16/379,821, filed on Apr. 10, 2019, now Pat. No. 11,307,500.

(Continued)

(51) Int. Cl.
*G03F 7/42* (2006.01)
*G03F 7/00* (2006.01)
(Continued)

(52) U.S. Cl.
CPC ............ *G03F 7/427* (2013.01); *G03F 7/0043* (2013.01); *G03F 7/027* (2013.01); *G03F 7/70033* (2013.01); *H01L 21/0273* (2013.01); *H01L 21/3081* (2013.01); *H01L 21/3086* (2013.01); *H01L 21/31111* (2013.01); *H01L 21/31138* (2013.01); *H01L 21/56* (2013.01); *H01L 21/563* (2013.01); *H01L 21/565* (2013.01); *H01L 23/3128* (2013.01); *H01L 23/5283* (2013.01);

(Continued)

(58) Field of Classification Search
CPC ............ H01L 21/0273; H01L 21/3081; H01L 21/3086; H01L 21/31111; H01L 21/31138; H01L 21/56; H01L 2224/023; H01L 2224/02373; G03F 7/027; G03F 7/0043; G03F 7/42; G03F 7/423; G03F 7/426; G03F 7/427

See application file for complete search history.

(56) References Cited

U.S. PATENT DOCUMENTS 6,207,358 B1 * 3/2001 Jeon .................... G03F 7/422
                                                                 134/1.3
8,764,995 B2    7/2014 Chang et al.
(Continued)

*Primary Examiner* — Herve-Louis Y Assouman
*Assistant Examiner* — Christopher M Roland
(74) *Attorney, Agent, or Firm* — JCIPRNET

(57) ABSTRACT

A method for removing a resist layer is provided. A resist layer is formed with a material comprising a metal oxide core with organic ligands. A chlorine-containing compound or a methyl group-containing compound is globally applied onto the resist layer to allow the chlorine-containing compound or the methyl group-containing compound to perform a ligand exchange process with the resist layer so as to remove the resist layer through sublimation.

20 Claims, 24 Drawing Sheets

Related U.S. Application Data

(60) Provisional application No. 62/752,354, filed on Oct. 30, 2018.

(51) Int. Cl.

| | | |
|---|---|---|
| *G03F 7/004* | (2006.01) | |
| *G03F 7/027* | (2006.01) | |
| *H01L 21/027* | (2006.01) | |
| *H01L 21/308* | (2006.01) | |
| *H01L 21/311* | (2006.01) | |
| *H01L 21/56* | (2006.01) | |
| *H01L 23/00* | (2006.01) | |
| *H01L 23/31* | (2006.01) | |
| *H01L 23/528* | (2006.01) | |

(52) U.S. Cl.
CPC ............. *H01L 24/09* (2013.01); *H01L 24/17* (2013.01); *H01L 24/19* (2013.01); *H01L 2224/023* (2013.01); *H01L 2224/02373* (2013.01); *H01L 2224/02381* (2013.01); *H01L 2224/0401* (2013.01); *H01L 2224/04105* (2013.01); *H01L 2224/12105* (2013.01); *H01L 2224/92244* (2013.01)

(56) References Cited

U.S. PATENT DOCUMENTS

| | | |
|---|---|---|
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,000,584 B2 | 4/2015 | Lin et al. |
| 9,012,132 B2 | 4/2015 | Chang |
| 9,028,915 B2 | 5/2015 | Chang et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,093,530 B2 | 7/2015 | Huang et al. |
| 9,111,949 B2 | 8/2015 | Yu et al. |
| 9,146,469 B2 | 9/2015 | Liu et al. |
| 9,184,054 B1 | 11/2015 | Huang et al. |
| 9,213,234 B2 | 12/2015 | Chang |
| 9,223,220 B2 | 12/2015 | Chang |
| 9,256,123 B2 | 2/2016 | Shih et al. |
| 9,256,133 B2 | 2/2016 | Chang |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,529,268 B2 | 12/2016 | Chang et al. |
| 9,536,759 B2 | 1/2017 | Yang et al. |
| 9,548,303 B2 | 1/2017 | Lee et al. |
| 11,307,500 B2 * | 4/2022 | Ouyang ............... H01L 21/563 |
| 2006/0122084 A1 * | 6/2006 | Park ..................... C11D 11/0047 |
| | | 510/175 |
| 2006/0292777 A1 * | 12/2006 | Dunbar ............... H01L 21/02554 |
| | | 257/E29.295 |
| 2011/0281491 A1 * | 11/2011 | Nagasawa ............ G02F 1/13394 |
| | | 445/24 |
| 2015/0234272 A1 * | 8/2015 | Sarma ................... G03F 7/0045 |
| | | 430/326 |
| 2017/0141053 A1 * | 5/2017 | Chen ..................... H01L 24/02 |
| 2017/0365478 A1 * | 12/2017 | George ................... C23F 1/12 |
| 2018/0025936 A1 * | 1/2018 | Singh ................ H01L 21/76816 |
| | | 438/618 |
| 2021/0193472 A1 * | 6/2021 | Jin ....................... H01L 21/3065 |
| 2021/0398849 A1 * | 12/2021 | Tapily ............... H01L 21/76843 |
| 2023/0062485 A1 * | 3/2023 | Lim ................... H01J 37/32357 |

* cited by examiner

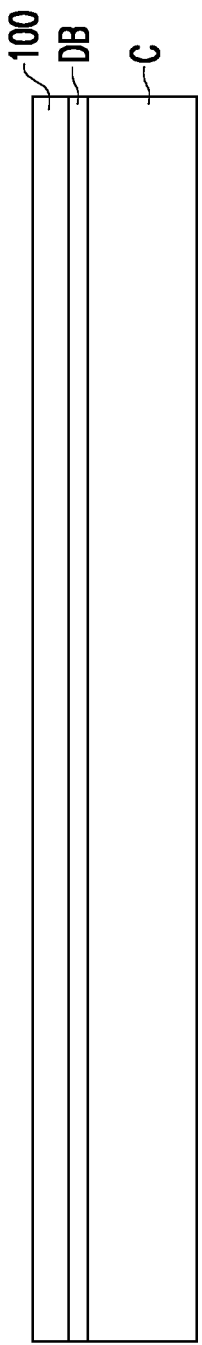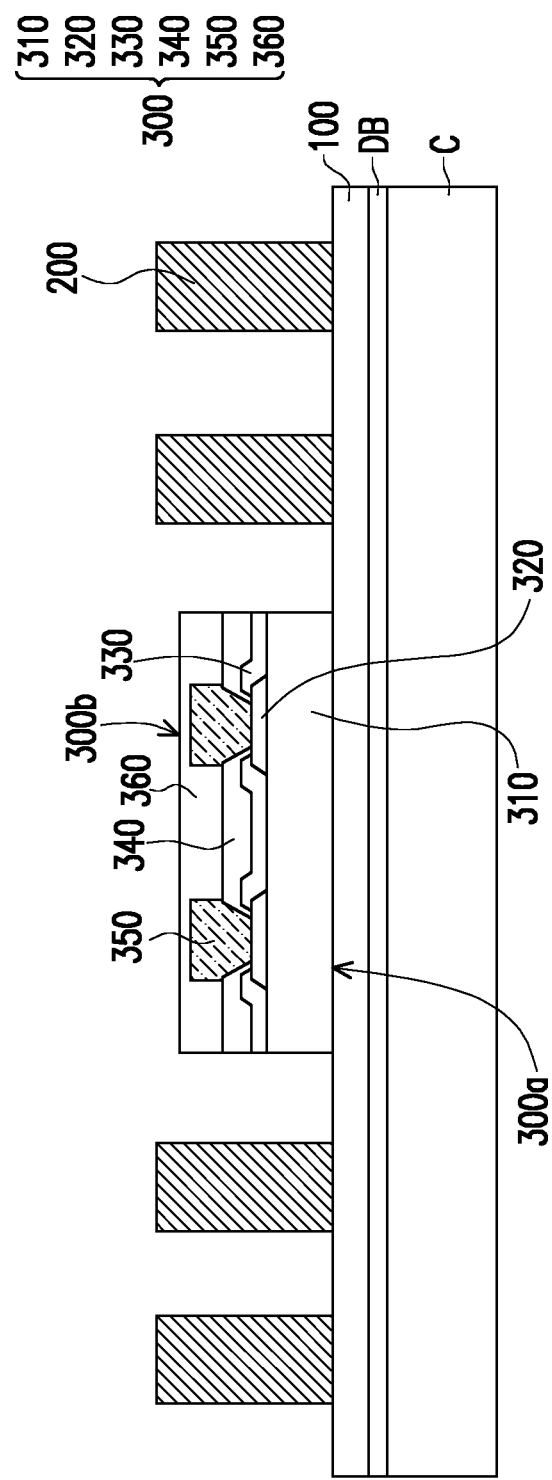

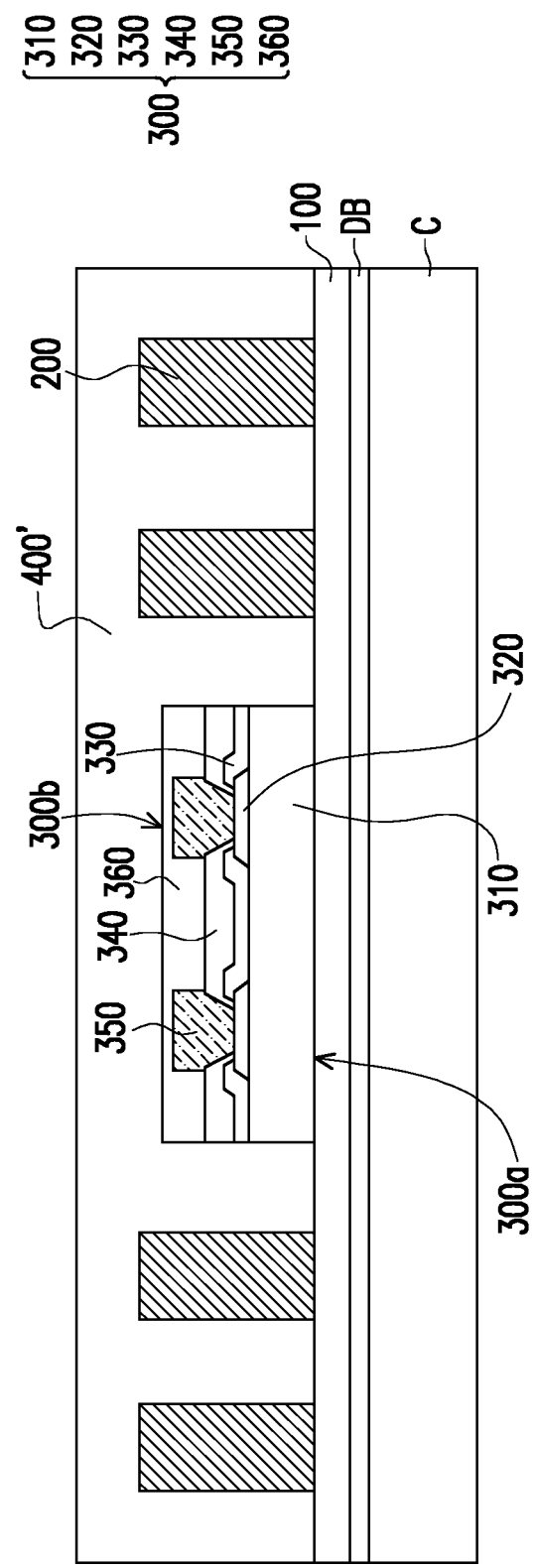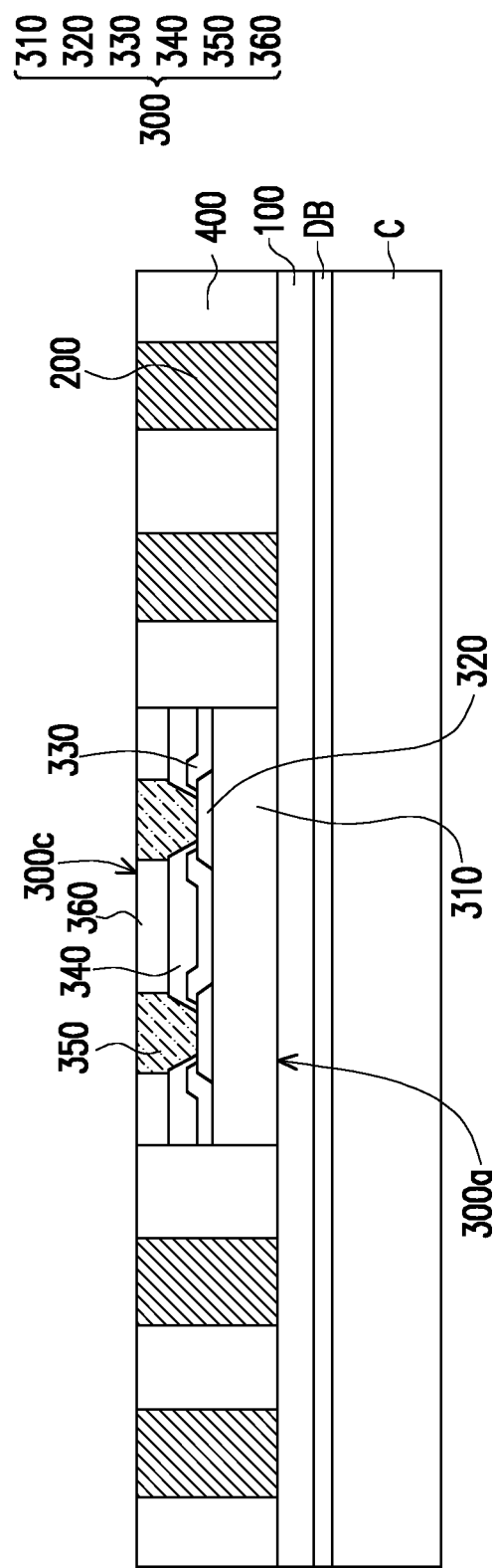

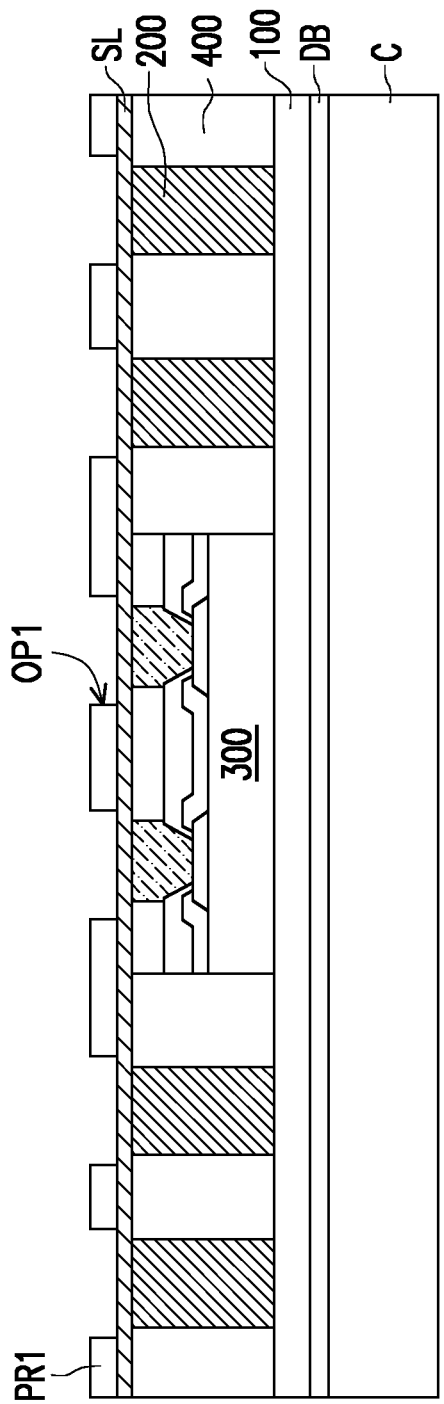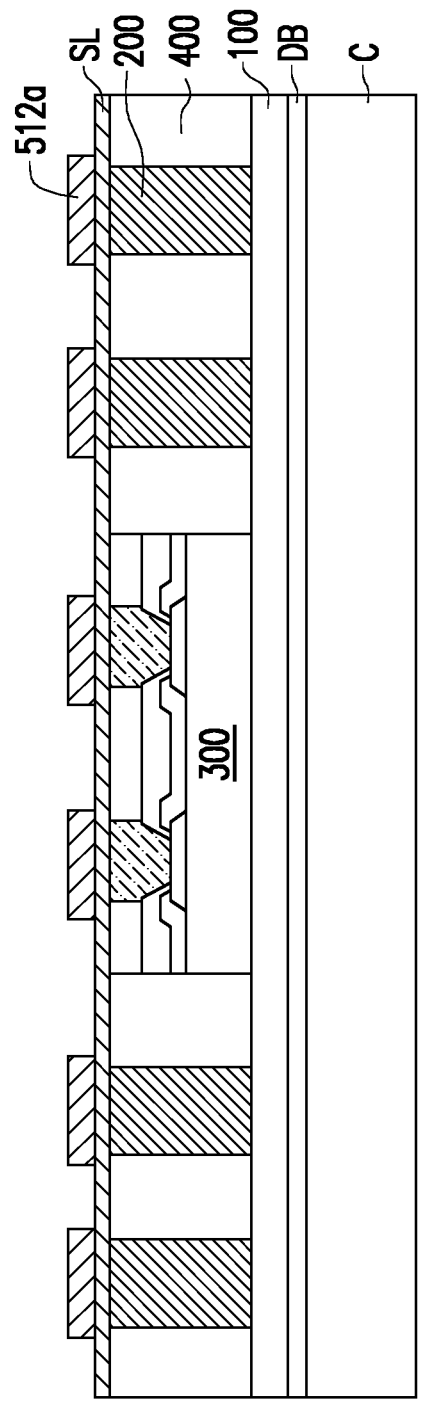
FIG. 17
FIG. 18

METHOD FOR REMOVING RESIST LAYER, METHOD OF FORMING A PATTERN AND METHOD OF MANUFACTURING A PACKAGE

CROSS-REFERENCE TO RELATED APPLICATION

This application is a continuation application of and claims the priority benefit of a prior application Ser. No. 16/379,821, filed on Apr. 10, 2019, which claims the priority benefit of U.S. provisional application Ser. No. 62/752,354, filed on Oct. 30, 2018. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. For example, pattern forming technologies play significant roles in the wafer level packaging. How to ensure the forming quality and simplicity of a patterning process have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 to FIG. 30 are schematic cross-sectional views illustrating intermediate stages of a process of manufacturing a package in accordance with some embodiments of the disclosure.

DETAILED DESCRIPTION

Figure 1:
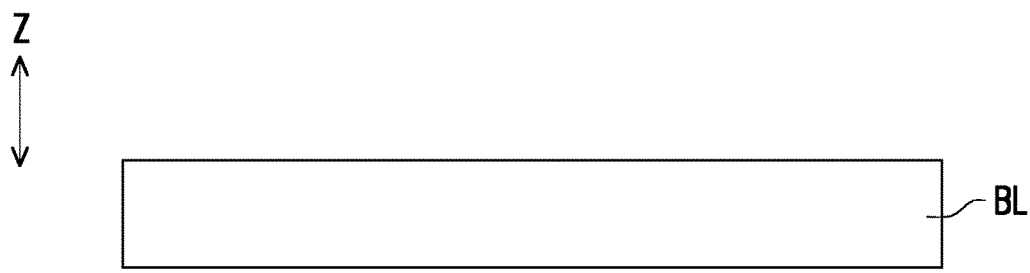
FIG. 1, FIG. 2A, FIG. 3, FIG. 4A, FIG. 5, FIG. 6, FIG. 7, FIG. 8A, and FIG. 9 are schematic cross-sectional views illustrating a method for forming a pattern in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11:
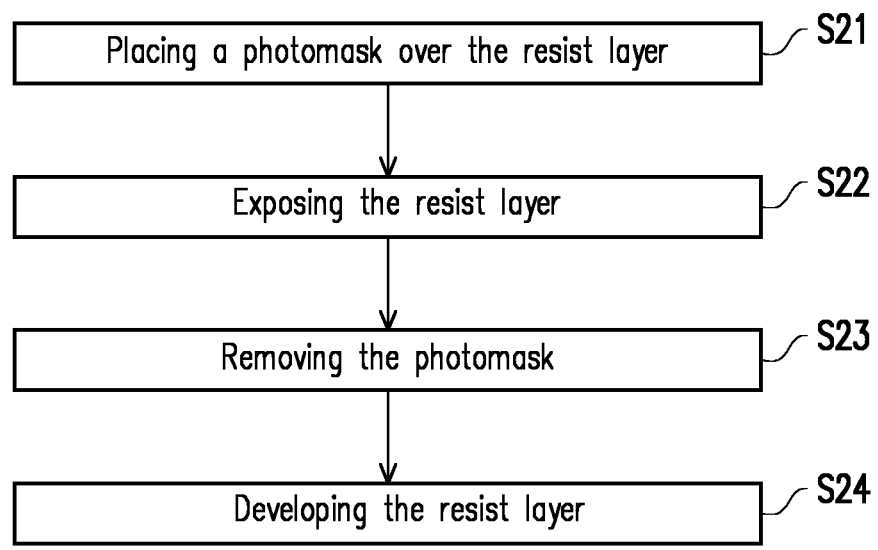
FIG. 11 is a flow chart illustrating a method for pattering a resist layer in accordance with some embodiments of the disclosure.
Figure 12:
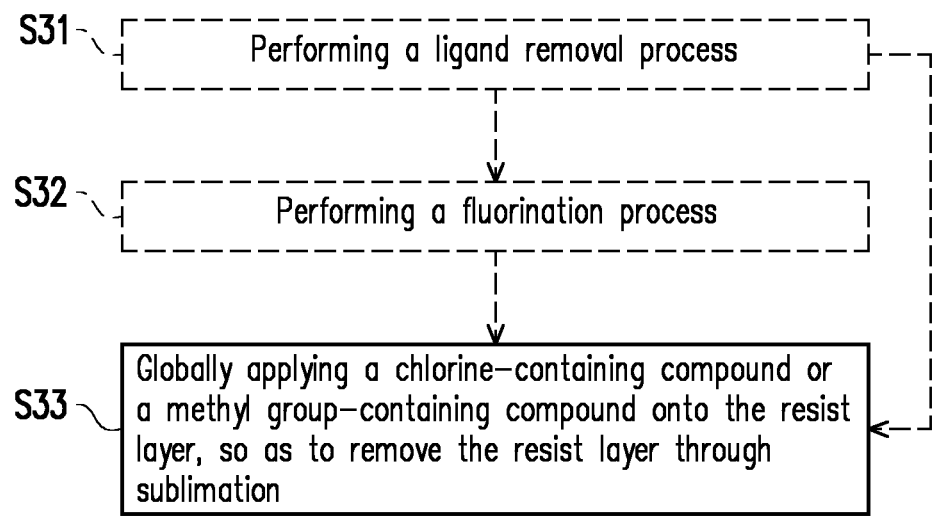
FIG. 12 is a flow chart illustrating a method for removing a resist layer in accordance with some embodiments of the disclosure.

FIG. 1, FIG. 2A, FIG. 3, FIG. 4A, FIG. 5, FIG. 6, FIG. 7, FIG. 8A, and FIG. 9 are schematic cross-sectional views illustrating a method for forming a pattern in accordance with some embodiments of the disclosure. FIG. 2B depicts a possible composition of a resist forming a resist layer adapted in a method for forming a pattern in accordance with some embodiments of the disclosure. FIG. 4B illustrates a chemistry for pattering a resist layer in a method for forming a pattern in accordance with some embodiments of the disclosure. FIG. 8B to FIG. 8E each illustrate a mechanism of removing a resist layer in a method for forming a pattern in accordance with some alternative embodiments of the disclosure. FIG. 10 is a flow chart illustrating a method for forming a pattern in accordance with some embodiments of the disclosure. FIG. 11 is a flow chart illustrating a method for pattering a resist layer in accordance with some embodiments of the disclosure. FIG. 12 is a flow chart illustrating a method for removing a resist layer in accordance with some embodiments of the disclosure. In some embodiments, the method for forming a pattern, the method for patterning a resist layer, and the method for removing a resist layer may be parts of a wafer level packaging process, however the disclosure is not limited thereto. In some alternative embodiments, the method for forming a pattern, the method for patterning a resist layer, and the method for removing a resist layer, at least one or all, may not be part of a wafer level packaging process. The embodiments are intended to provide further explanations but are not used to limit the scope of the disclosure.

Referring to FIG. 1, in some embodiments, a base layer BL is provided; in accordance with the step S11 of FIG. 10. In some embodiments, the base layer may be a conductive layer, a semiconductor layer, or an insulating layer. For example, the conductive layer may be a layer formed of a metal or a metal alloy. Examples of the metal or metal alloy may be tungsten (W), cobalt (Co), copper (Cu), aluminum (Al), nickel (Ni), ruthenium (Ru), gold (Au), silver (Ag), molybdenum (Mo), manganese (Mg), zirconium (Zr), other suitable materials, and/or combinations thereof, where the conductive layer may be formed by deposition, electroplating, electroless plating, other suitable processes, and/or combinations thereof.

For example, the semiconductor layer may be a layer formed of a semiconductor material. Examples of semiconductor material may be silicon (Si), germanium (Ge), silicon carbide (SiC), gallium arsenide (GaAs), gallium phosphide (GaP), indium phosphide (InP), indium arsenide (InAs), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), indium antimonide (InSb), silicon germanium (SiGe), and/or any other suitable semiconductor material, where the semiconductor layer may be formed by deposition.

For example, the insulating layer may be a layer formed of a dielectric material. Examples of the dielectric material may be an oxide, such as silicon oxide or silicon oxynitride; a nitride, silicon nitride or silicon carbon nitride; a polymer-based dielectric material, such as polyimide, epoxy resin, acrylic resin, phenol resin, benzocyclobutene (BCB), polybenzoxazole (PBO), and/or any other suitable polymer-based dielectric material, where the dielectric layer may be formed by deposition. The aforesaid deposition process may include, but may not be limited to, chemical vapor deposition (CVD), plasma-enhanced CVD (PECVD), physical vapor deposition (PVD), atomic layer deposition (ALD), other suitable processes, and/or combinations thereof, for example. In some alternative embodiments, the dielectric material may include metal oxides or metal nitrides. Examples of the metal oxide includes $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or the like. Examples of the metal nitride includes TiN, TaN, WN, TiAlN, TaCN, or the like. In some further alternative embodiments, the dielectric material may include a silicate such as HfSiO, HfSiON, LaSiO, AlSiO, or the like.

It is understood that the materials listed above are merely exemplary illustration of the base layer BL, and the disclosure is not limited to the material of the base layer BL. In some embodiments, the thickness and forming process of the base layer BL may be selected based on the design layout and the demand in addition to the selection of the material for forming the base layer BL, and thus the disclosure may not be limited herein. As shown in FIG. 1, the base layer BL is in a form of a blanket layer, for example; however, the disclosure is not limited thereto.

Figure 2A:
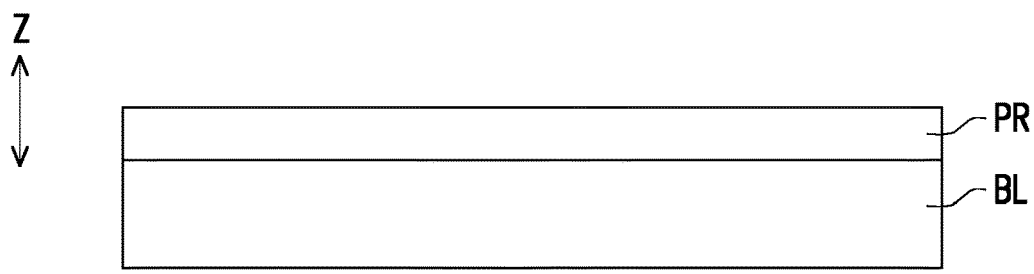
Figure 2B:
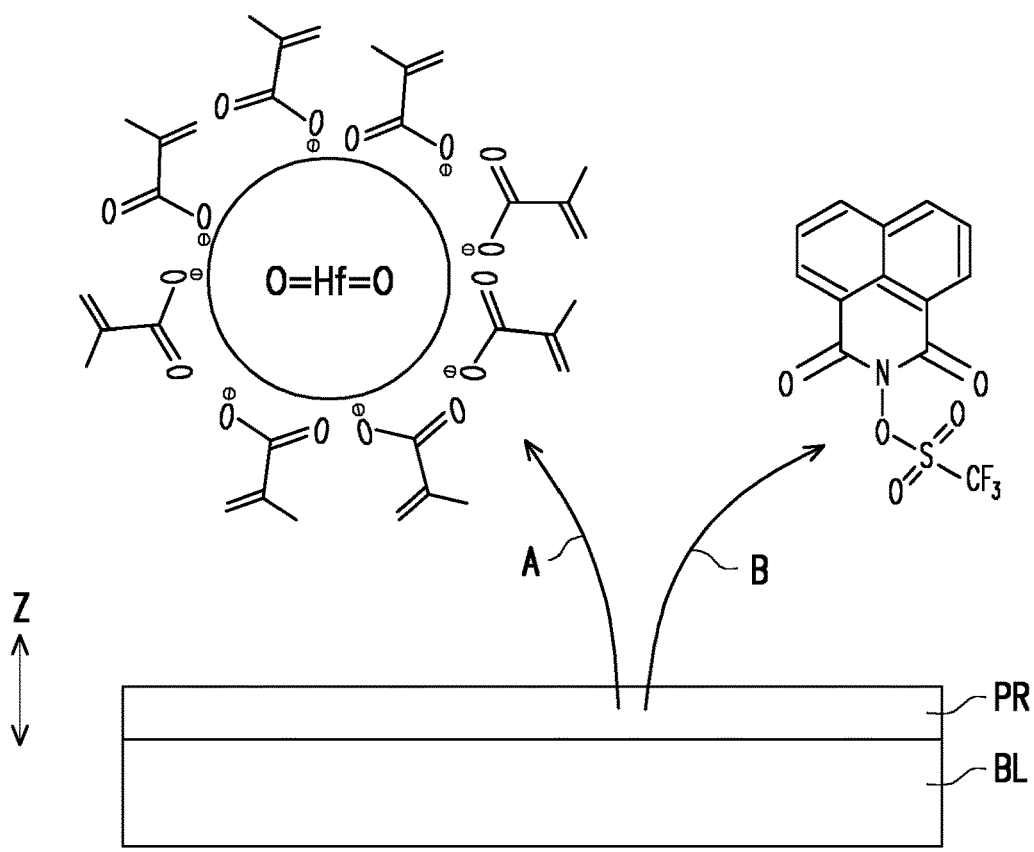
FIG. 2B depicts a possible composition of a resist forming a resist layer adapted in a method for forming a pattern in accordance with some embodiments of the disclosure.

Referring to FIG. 2A, in some embodiments, a resist layer PR is formed over the base layer BL; in accordance with the step S12 of FIG. 10. As shown in FIG. 2A, the resist layer PR is formed on the base layer BL as a blanket layer to completely cover the based layer BL. In other words, the base layer BL is not accessibly revealed by the resist layer PR. In some embodiments, a thickness of the resist layer PR may range from about 20 nm to about 60 nm, which is measured along a stacking direction of the base layer BL and the resist layer PR, e.g. a direction Z shown in FIG. 2A.

In some embodiments, the resist layer PR is formed with a material including a metal oxide core with ligands and a photoactive compound. Examples of the metal oxide core may include, but may not be limited to, hafnium oxide ($HfO_2$), zirconium oxide ($ZrO_2$), titanium oxide ($TiO_2$), tin oxide ($SnO_2$), or other suitable metal oxide. An example of the ligands may include, but may not be limited to, 2-methylpropenoic acid, methylmathacrylic acid, sulfonic acid, benzoic acid. In some embodiments, a ratio of an atomic percentage of the ligands to an atomic percentage of the metal oxide core is ranging generally from 20% to 50%. In some embodiments, the metal oxide core is surrounded by the ligands.

In some embodiments, the photoactive compound may include a photo-acid generator or a photo-initiator. An example of the photo-acid generator may include, but may not be limited to, N-hydroxynaphthalimide trifluoromethanesulfonate. An example of the photo-initiator may include, but may not be limited to, 2,2-Dimethoxy-2-phenylacetophenone. The photoactive compound is in an amount ranging generally from 1% to 10% by weight based on 100 parts by weight of the metal oxide core and the ligands.

In some embodiments, a composition of the resist layer PR may include hafnium oxide as the metal oxide core with the ligands of methacrylic acid (together indicated by a arrow A) and N-hydroxynaphthalimide trifluoro-methanesulfonate as the photoactive compound (indicated by a arrow B), see FIG. 2B. However, the disclosure is not limited thereto. In alternative embodiments (not shown), the composition of the resist layer PR may include hafnium oxide as the metal oxide core, methacrylic acid as the ligands, and 2,2-Dimethoxy-2-phenylacetophenone as the photoactive compound.

In some embodiments, the material forming the resist layer PR may be further mixed into in the solvent using any of the mixing manners commonly used in the art (for example, using a mixer or a dispersing device) to form a liquid dispersion. There is no specific limitation to the solvent of the disclosure and an amount thereof as long as the solvent can sufficiently dissolve the metal oxide core, the ligands and the photoactive compound and will not interact with these components. The solvent is preferably volatile. For example, for the liquid dispersion with about 1% to about 10% by weight of the metal oxide core and the ligands, the rotation speed for mixing may be in a range of about 200 rpm to about 2000 rpm.

Examples of the solvent include, but are not limited to, (1) alkylene glycol monoalkyl ether compounds: ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (2) alkylene glycol monoalkyl ether acetate compounds: ethylene glycol monomethyl ether acetate, ethylene glycol monoethyl ether acetate, propylene glycol monomethyl ether acetate, propylene glycol monoethyl ether acetate, and the like; (3) other ether compounds: diethylene glycol dimethyl ether, diethylene glycol methyl ethyl ether, diethylene glycol diethyl ether, tetrahydrofuran, and the like; (4) ketone compounds: methyl ethyl ketone, cyclohexanone, 2-heptanone, 3-heptanone, diacetone alcohol, and the like; (5) alkyl lactate compounds: methyl 2-hydroxypropionate, ethyl 2-hydroxypropionate, and the like; (6) other ester compounds: methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, ethyl 2-oxybutyrate, and the like; (7) aromatic hydrocarbon compounds: toluene, xylene, and the like; (8) carboxylic amine compounds: N-methylpyrrolidone, N,N-dimethylformamide, N,N-dimethylacetamide, and the like; and (9) any combinations of the aforesaid compounds (1)-(8). The aforesaid examples of the solvent can be used alone or in combinations thereof.

It is understood that the materials listed above are merely exemplary illustration of the components used in the material forming the resist layer PR. Based on the design layout and the demand, the disclosure is not limited to these materials. In some embodiments, the formation of the resist layer PR includes a spin-on coating method and the like, for example. In addition, a pre-baking process may be performed on the resist layer PR coating on the base layer BL to form a film by removing excess solvent, if need.

In some embodiments, the resist layer PR, for example, includes a positive resist layer or a negative resist layer, that is suitable for a subsequent patterning process such as a photolithography process with a mask (for instance, an extreme ultraviolet (EUV) lithography) or a mask-less photolithography process (for instance, an electron-beam (e-beam) writing or an ion-beam writing). In the disclosure, the resist layer PR may be referred to as a photoresist layer.

Referring to FIG. 3 to FIG. 6, in some embodiments, the resist layer PR is patterned to form a patterned resist layer PR'; in accordance with the step S13 of FIG. 10 (which at least involves steps S21 to S24 of FIG. 11, for example). For example, the EUV lithography is employed during the process of patterning the resist layer PR in the disclosure for illustration purpose, however the disclosure is not limited thereto.

Figure 3:
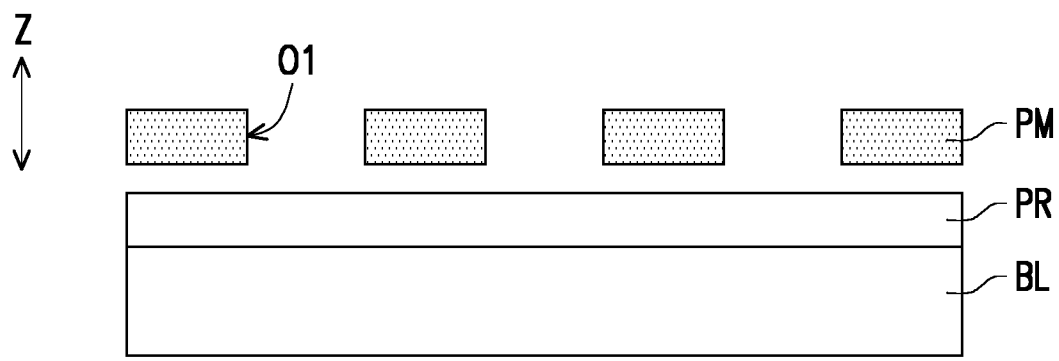

In some embodiments, as shown in FIG. 3, a photomask PM is provided and placed over the resist layer PR; in accordance with the step S21 of FIG. 11. For example, the photomask PM has a predetermined target pattern with a plurality of openings O1 exposing the resist layer PR underneath thereto. The shape of the predetermined target pattern included in the photomask PM is not limited to the disclosure, and is selected and designated based on the design layout and the demand. The number and shape of the openings O1 (or saying recesses) corresponding to the predetermined target pattern included in the photomask PM is thus not limited to the disclosure.

Figure 4A:
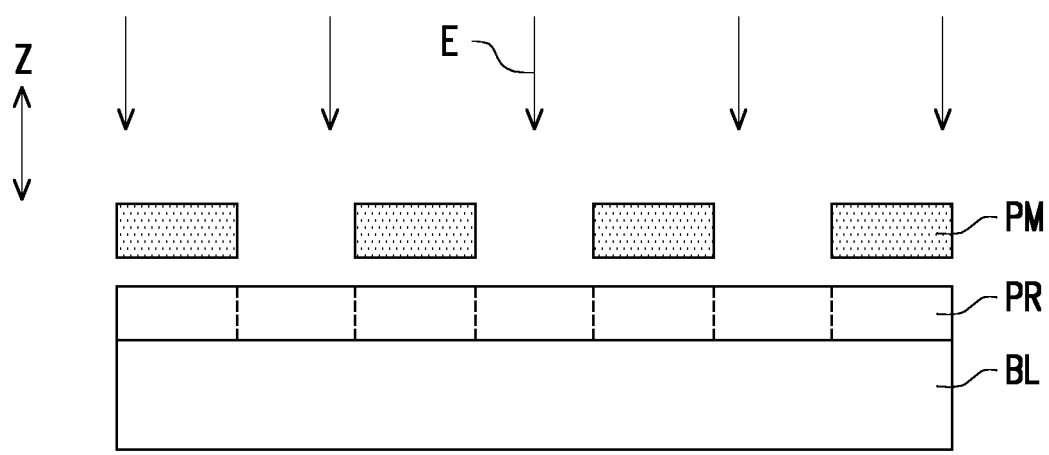
Figure 4B:
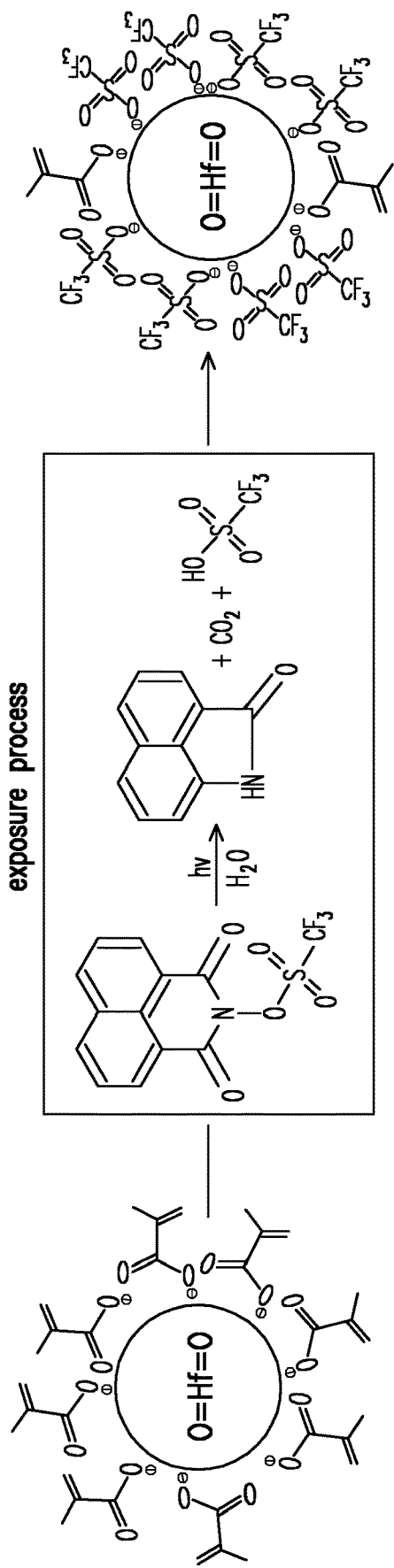
FIG. 4B illustrates a chemistry for pattering a resist layer in a method for forming a pattern in accordance with some embodiments of the disclosure.

In some embodiments, as shown in FIG. 4A, an exposure process E is performed on the resist layer PR, where the predetermined target pattern included in the photomask PM is transferred onto the resist layer PR; in accordance with the step S22 of FIG. 11. For example, in FIG. 4A, the exposure process E includes performing an EUV lithography process. In some embodiments, the EUV lithography process is performed by irradiating EUV light (involving a EUV exposure process), through the photomask PM, onto the resist layer PR to transfer the predetermined target pattern included in the photomask PM to the resist layer PR. In some embodiments, after the EUV lithography process, a post-baking process may be performed to the resist layer PR. Depending on the material(s) or type of the resist layer PR, polymers of the resist layer PR may undergo different reactions/mechanisms for pattern transfer upon the irradiation of the EUV light and post-baking. For one example, the portions of the resist layer PR of a positive type exposed to the EUV light may be easily removed by a development agent as comparing to a portion of the resist layer PR of the positive type not exposing to the EUV light. For another example, on the other hand, the portions of the resist layer PR of a negative type exposed to the EUV light may be hard to be removed by a development agent as comparing to a portion of the resist layer PR of the negative type not exposing to the EUV light. In some embodiments, as the resist layer PR is exposed to the EUV light via the photomask PM, the photoactive compound (e.g. N-hydroxynaphthalimide trifluoromethanesulfonate) is dissociated to liberate a strong photoacid (e.g. sulfonic acid such as trifluorosulphonate acid) having a very high binding affinity towards the metal oxide core (e.g. hafnium oxide) than the ligands (e.g. methacrylic acid) surrounding thereto, such that the strong photoacid at least partially or completely displaces the ligands and preferentially binds to the metal oxide core, which changes the surface chemistry of the metal oxide core, see FIG. 4B.

Figure 5:
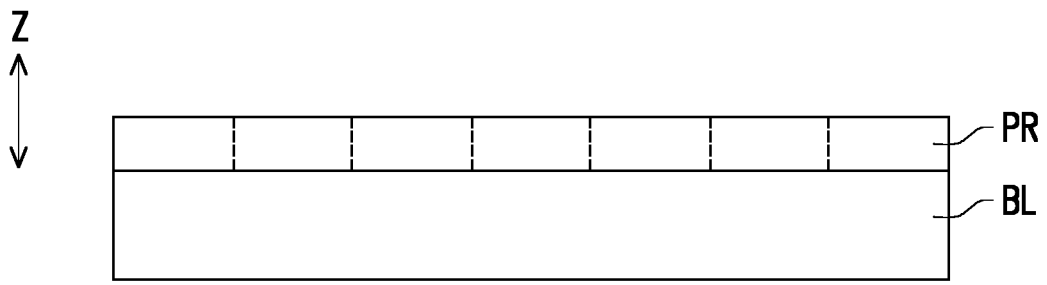

In some embodiments, as shown in FIG. 5, the photomask PM are removed from the top of the resist layer PR; in accordance with the step S23 of FIG. 11. In other words, the resist layer PR are removed from the photomask PM.

Figure 6:
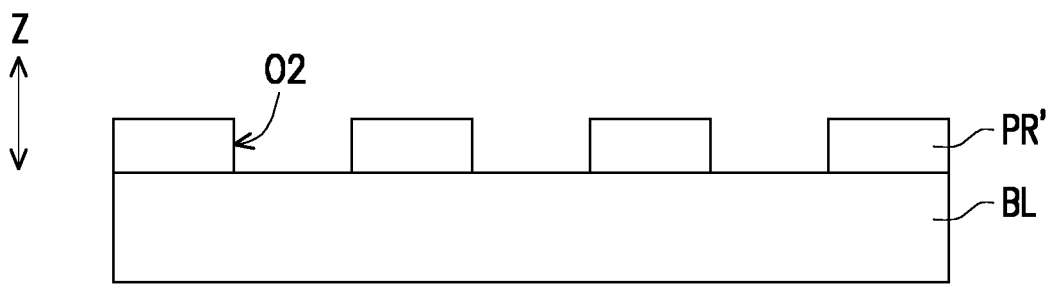

In some embodiments, as shown in FIG. 6, the resist layer PR is developed through a corresponding development agent due to the change in the surface chemistry thereof, so that portions of the resist layer PR is removed to form a patterned resist layer PR'; in accordance with the step S24 of FIG. 11. For example, the portions of the resist layer PR, which are exposed to the EUV light or not exposed to the EUV light (depending on the material(s) or type of the resist layer PR), are removed with a development agent in a developing process. For example, in FIG. 6, the resist layer PR is a positive resist layer, and the portions of the resist layer PR, which are exposed to the EUV light, are removed to form a pattern having recesses O2 corresponding to the openings O1 included in the predetermined target pattern of the photomask PM with a development agent of a positive resist. However, the disclosure is not limited thereto; in an alternative embodiment, the resist layer PR is, for example, a negative resist layer, the portions of the resist layer PR, which are not exposed to the EUV light, are removed to form a pattern having recesses corresponding to the non-openings included in the predetermined target pattern of the photomask PM with a development agent of a negative resist. The development agent may be chosen based on the type of the resist layer PR as well as process needs. In some embodiments, the developing process may include, but may not be limited to, a dipping bath process or a spray process, the disclosure is not limited thereto.

In some embodiments, as mentioned above, during the step of the EUV exposure process for patterning the resist layer PR in the disclosure, the photoactive compound such as the photo-acid generator (e.g. N-hydroxynaphthalimide trifluoromethanesulfonate), receives energy from the EUV light to liberate a strong photo-acid, a sulfonic acid, see FIG. 4B (which shows a possible composition of the patterned resist layer PR'). On the other hand, in other embodiments, during the step of the EUV exposure process for patterning the resist layer PR in the disclosure, the photoactive compound such as the photo-initiator (e.g. 2,2-Dimethoxy-2-phenylacetophenone) is dissociated by receiving the energy from the EUV light to liberate strong photo-acids, a benzoic acid. In some embodiments, the ligands surrounding the metal oxide core in the resist layer PR are replaced by one of the aforesaid strong acids (for example, the sulfonic acid such as trifluorosulphonate acid shown in FIG. 4B); and then the patterned resist layer PR' is formed by performing the development process in FIG. 6. In the disclosure, a material of the patterned resist layer PR' includes a metal oxide core with ligands. Examples of the metal oxide core included in the patterned resist layer PR' may include, but may not be limited to, hafnium oxide ($HfO_2$), zirconium oxide ($ZrO_2$), titanium oxide ($TiO_2$), tin oxide ($SnO_2$), or other suitable metal oxide. In certain embodiments, the ligands are organic ligands. An example of the organic ligands may include, but may not be limited to, a benzoic acid or a sulfonic acid. In some embodiments, the organic ligands may further include a methacrylic acid. In some embodiments, a ratio of an atomic percentage of the organic ligands to an atomic percentage of the metal oxide core is ranging generally from 10% to 50%. In some embodiments, the metal oxide core is surrounded by the organic ligands. As shown in FIG. 6, the patterned resist layer PR' is formed on the base layer BL, where portions of the base layer BL are accessibly revealed by the patterned resist layer PR'.

Figure 7:
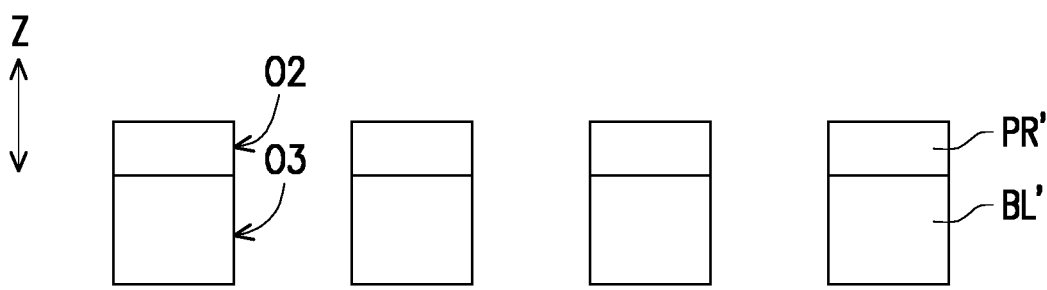

Referring to FIG. 7, in some embodiments, the base layer BL is patterned to formed a patterned base layer BL' by using the patterned resist layer PR' as a mask; in accordance with the step S14 of FIG. 10. In some embodiments, the patterning process includes, but is not limited to, performing a dry etching process, a wet etching process, or a combination thereof. For example, in FIG. 7, the patterned resist layer PR' is used as the etching mask in a dry etching process for removing a portion of the base layer BL, so as to form a patterned base layer BL' with recesses O3 corresponding to the recesses O2 included in the patterned resist layer PR'. The disclosure is not limited thereto.

Figure 8A:
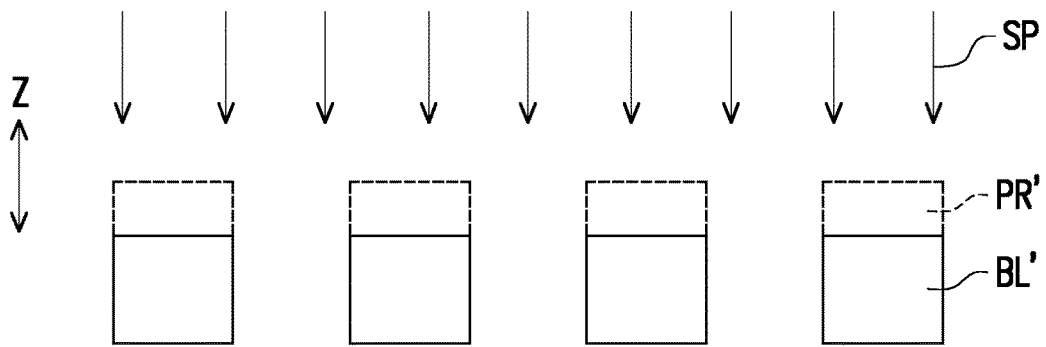
Figure 9:
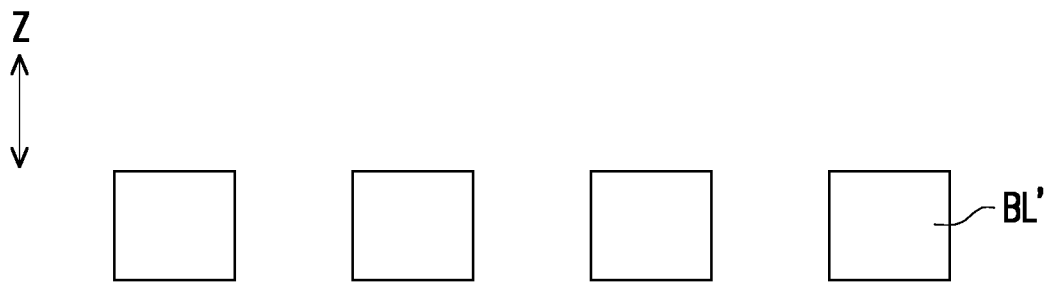
Figure 10:
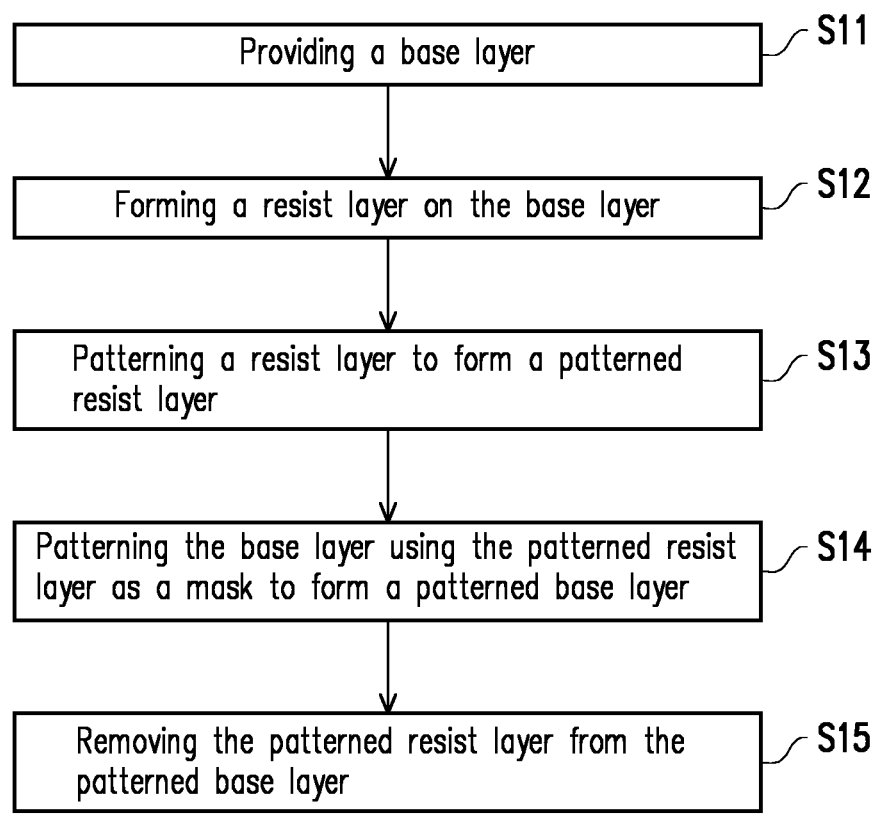
FIG. 10 is a flow chart illustrating a method for forming a pattern in accordance with some embodiments of the disclosure.

Referring to FIG. 8A and FIG. 9, in some embodiments, the patterned resist layer PR' is removed from the patterned base layer BL'; in accordance with the step S15 of FIG. 10 (which involves the step S33 of FIG. 12, and may further involve at least one of the steps S31 to S32 of FIG. 12, for example). For example, a metal oxide core of $HfO_2$ and an organic ligand of sulfonic acid are employed as the components of the material of the patterned resist layer PR' in the disclosure for illustration purpose, however the disclosure is not limited thereto.

In some embodiments, as shown in FIG. 8A and FIG. 9, a chlorine-containing compound or a methyl group-containing compound is globally applied onto the patterned resist layer PR' to allow the chlorine-containing compound or the methyl group-containing compound to perform a ligand exchange process with the patterned resist layer PR' so as to remove the patterned resist layer PR' through sublimation; in accordance with FIG. 8B to FIG. 8E and the step S33 of FIG. 12. In some embodiments, the chlorine-containing compound includes, but is not limited to, tetrachlorosilane ($SiCl_4$, in gas phase) or dimethylacetamide ($C_4H_9NO$, in gas phase). In some embodiments, the methyl group-containing compound includes, but is not limited to, trimethylaluminum ($C_6H_{18}Al_2$, in gas phase). However, it is understood that the materials listed above are merely exemplary illustration, and the disclosure is not limited thereto. In some embodiments, the chlorine-containing compound or the methyl group-containing compound is globally applied onto the patterned resist layer PR' by a spray process (indicated as SP shown in FIG. 8A). In some embodiments, during the ligand exchange process, a workable temperature ranges from about 100° C. to about 500° C. and a workable pressure ranges from about 10 mTorr to about 100 mTorr. In an alternative embodiment, the chlorine-containing compound or the methyl group-containing compound may be globally applied onto the patterned resist layer PR' by spin-coating, and the disclosure is not limited thereto.

Figure 8B:
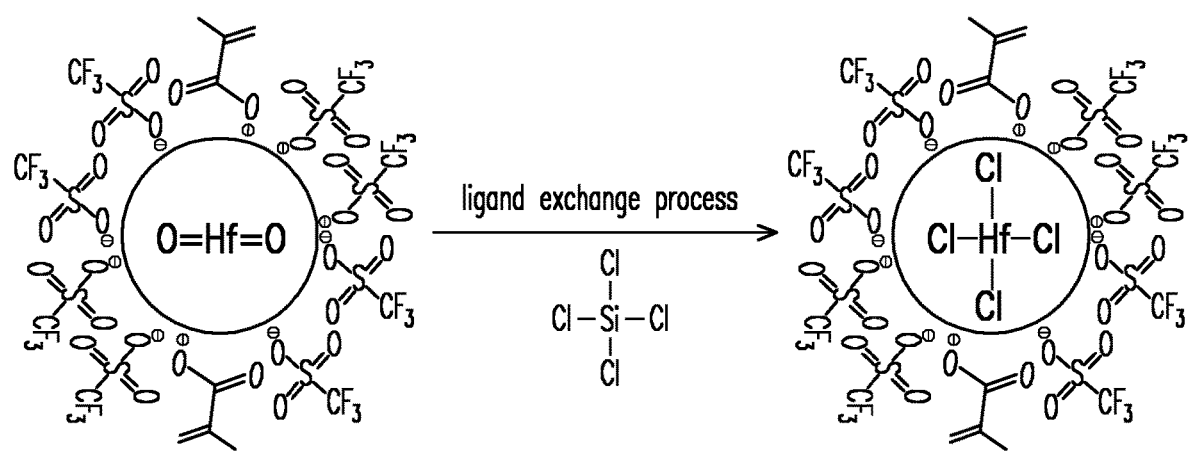
FIG. 8B illustrates a mechanism for removing a resist layer in a method for forming a pattern in accordance with some embodiments of the disclosure.

For example, as shown in FIG. 8A and FIG. 8B, during performing the ligand exchange process, the oxygen atoms surrounding each of the metal atoms in the metal oxide core (e.g. $HfO_2$) are replaced with chloro groups provided by the chlorine-containing compound (e.g. $SiCl_4$) to generate the volatile resultants (e.g. $HfCl_4$), where the chloro groups each have a very high binding affinity towards the metal atoms (e.g. hafnium) than the oxygen atoms, such that the chloro groups displace the oxygen atoms and preferentially bind to the metal atoms. In other words, through the ligand exchange process, the resultant of the patterned resist layer PR' is volatized, thereby the patterned resist layer PR' is removed from the patterned base layer BL' by sublimation, as shown in FIG. 9, for example. Owing to such ligand exchange reaction/process, a clean removal of the patterned resist layer PR' (after the EUV exposures) is carried out, where the patterned resist layer PR' is removed by sublimation instead of direct etching (e.g. a wet etching process, a dry etching process, or a combination thereof), and thus a lower manufacturing cost and environmentally friendly technology is achieved.

Figure 8C:
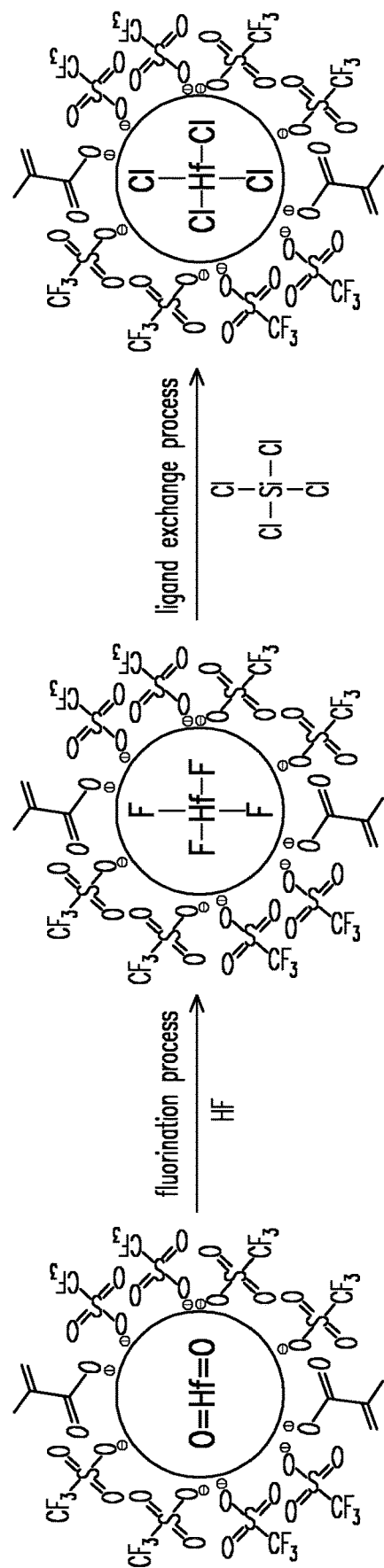
FIG. 8C illustrates a mechanism for removing a resist layer in a method for forming a pattern in accordance with some alternative embodiments of the disclosure.
Figure 8D:
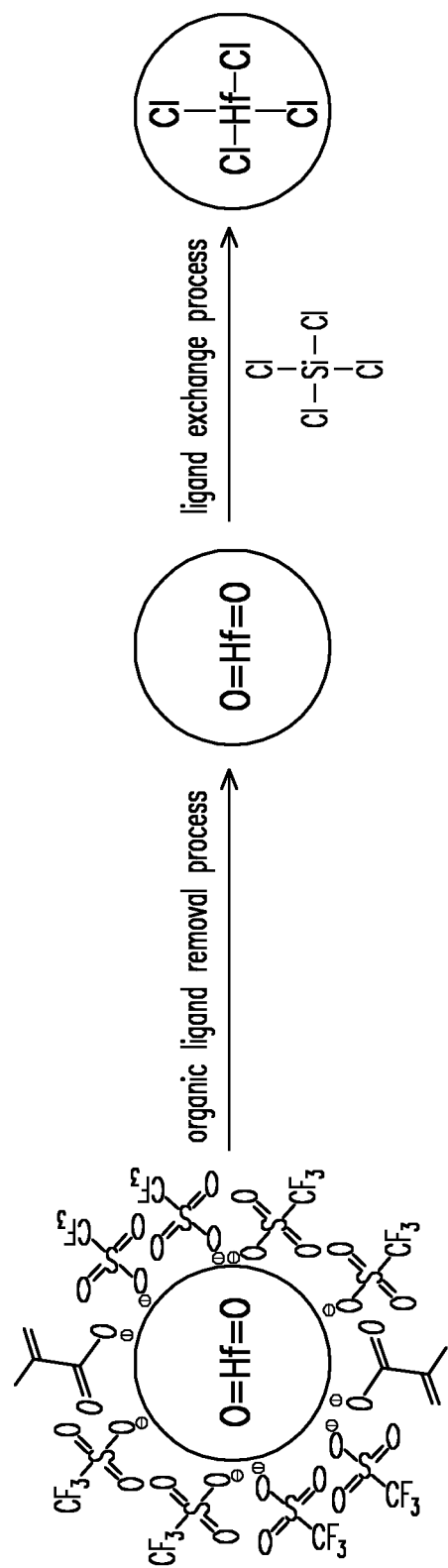
FIG. 8D illustrates a mechanism for removing a resist layer in a method for forming a pattern in accordance with some alternative embodiments of the disclosure.
Figure 8E:
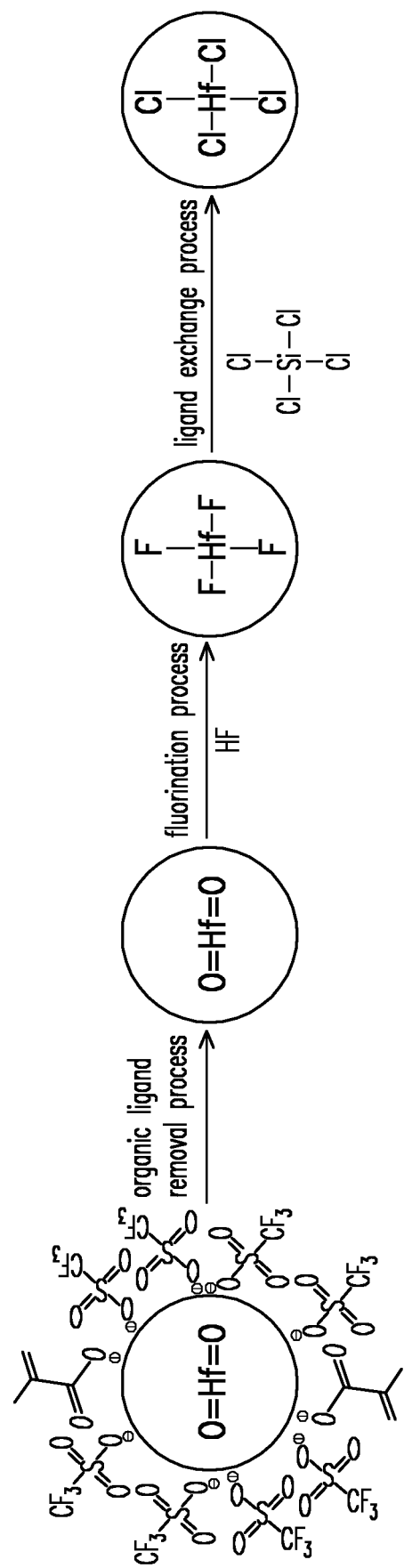
FIG. 8E illustrates a mechanism for removing a resist layer in a method for forming a pattern in accordance with some alternative embodiments of the disclosure.

In some embodiments, before performing the ligand exchange reaction/process and after patterning the base layer BL, a fluorination process may be further performed on the patterned resist layer PR'; in accordance with FIG. 8C, FIG. 8E, and the step S32 of FIG. 12. For example, the metal oxide core in the material of the patterned resist layer PR' reacts with a fluorine-containing compound to undergo the fluorination process, thereby forming a metal fluoride core. In other words, the oxygen atoms surrounding each of the metal atoms in the metal oxide core is replaced with the fluorine atoms to form the metal fluoride core. Note that, the fluorine atoms each have a very high binding affinity towards the metal atoms (e.g. hafnium) than the oxygen atoms, such that the fluorine atoms displace the oxygen atoms and preferentially bind to the metal atoms. An example of the fluorine-containing compound may include, but may not be limited to, a hydrofluoric acid. For example, the metal oxide core (e.g. $HfO_2$) in the material of the patterned resist layer PR' surrounding with the organic ligands (e.g. sulfonic acid) is reacted with the fluorine-containing compound to form the metal fluoride core (e.g. $HfF_4$) without surrounding by the organic ligands (e.g. sulfonic acid), the metal fluoride core with surrounding by the organic ligands (e.g. sulfonic acid), and/or a combination thereof. Owing to such fluorination process, the ligands exchange process is beneficiated and promoted. In detail, after the fluorination process, the oxygen atoms surrounding each of the metal atoms for the metal oxide core can be replaced by the fluorine atoms, which facilitates the sublimation since the fluorine atoms can be easily replaced by chlorine atoms or methyl group in the ligands exchange process (e.g. the step S33), and the resultants are volatile and can be easily removed by sublimation. In some embodiments, the fluorine-containing compound is globally applied onto the patterned resist layer PR' by a spray process or a dipping bath process. In some embodiments, during the fluorination process, a workable temperature ranges from about 100° C. to about 500° C. and a workable pressure ranges from about 10 mTorr to about 100 mTorr.

In alternative embodiments, before performing the ligand exchange reaction/process and after patterning the base layer BL, an organic ligand removal process may be further performed on the patterned resist layer PR'; in accordance with FIG. 8D, FIG. 8E, and the step S31 of FIG. 12. For example, the organic ligands (e.g. sulfonic acids) surrounding the metal oxide core (e.g. $HfO_2$) in the material of the patterned resist layer PR' are removed by the organic ligand removal process. In other words, the organic ligands (e.g. sulfonic acids) surrounding the metal oxide core (e.g. $HfO_2$) in the material of the patterned resist layer PR' are at least partially removed or completely removed from the metal oxide core (e.g. $HfO_2$). An example of the organic ligands removal process may include, but may be limited to, an ozone plasma process, an oxygen plasma process, or a remote oxygen plasma process. Owing to the organic ligand removal process, an amount of the final residues of the patterned resist layer PR' rest on the patterned base layer BL' can be greatly reduced and suppressed.

It is noted that, the organic ligand removal process (e.g. step S31) and/or the fluorination process (e.g. step S32) may optionally omitted from the method of removing the patterned resist layer PR'. In one embodiment, the patterned resist layer PR' is removed by sequentially performing the organic ligand removal process (e.g. step S31), the fluorination process (e.g. step S32), and the ligand exchange reaction/process (e.g. step S33), see FIG. 8E. For example, in accordance with FIG. 8E and the steps S31 to S33 of FIG. 12, after patterning the base layer BL, the organic ligand removal process may be firstly performed on the patterned resist layer PR' to remove the organic ligands (e.g. sulfonic acids) surrounding the metal oxide core (e.g. $HfO_2$) through oxygen ashing; the fluorination process may be then performed on the patterned resist layer PR' to form a metal fluoride core (e.g. $HfF_4$) by replacing the oxygen atoms surrounding each of the metal atoms in the metal oxide core (e.g. $HfO_2$) with fluorine atoms provided by hydrofluoric acid (e.g. HF); and lastly, the ligand exchange reaction/process is performed on the patterned resist layer PR' including the metal fluoride core to replace the fluorine atoms surrounding each of the metal atoms with chloro groups provided by the chlorine-containing compound (e.g. $SiCl_4$) to form the volatile resultants (e.g. $HfCl_4$), thereby the patterned resist layer PR' is removed by sublimation. In an alternative embodiment, the patterned resist layer PR' is removed by sequentially performing the organic ligand removal process (e.g. step S31) and the ligand exchange reaction/process (e.g. step S33), see FIG. 8D. For example, in accordance with FIG. 8D and the steps S31 and S33 of FIG. 12, after patterning the base layer BL, the organic ligand removal process may be firstly performed on the patterned resist layer PR' to remove the organic ligands (e.g. sulfonic acids) surrounding the metal oxide core (e.g. $HfO_2$), and then the ligand exchange reaction/process is performed on the patterned resist layer PR' including the metal oxide core (e.g. $HfO_2$) to replace the oxygen atoms surrounding each of the metal atoms with chloro groups provided by the chlorine-containing compound (e.g. $SiCl_4$) to form the volatile resultants (e.g. $HfCl_4$), thereby the patterned resist layer PR' is removed by sublimation. In another alternative embodiment, the patterned resist layer PR' is removed by sequentially performing the fluorination process (e.g. step S32) and the ligand exchange reaction/process (e.g. step S33), see FIG. 8C. For example, in accordance with FIG. 8C and the steps S32 and S33 of FIG. 12, after patterning the base layer BL, the fluorination process may be firstly performed on the patterned resist layer PR' to form a metal fluoride core (e.g. $HfF_4$) by replacing the oxygen atoms surrounding each of the metal atoms in the metal oxide core (e.g. $HfO_2$) with fluorine atoms provided by hydrofluoric acid (e.g. HF), and then the ligand exchange reaction/process is performed on the patterned resist layer PR' including the metal fluoride core (e.g. $HfF_4$) to replace the fluorine atoms surrounding each of the metal atoms with chloro groups provided by the chlorine-containing compound (e.g. $SiCl_4$) to form the volatile resultants (e.g. $HfCl_4$), thereby the patterned resist layer PR' is removed by sublimation. In a further alternative embodiment, the patterned resist layer PR' is removed by only performing the ligand exchange reaction/process (e.g. step S33), see FIG. 8B. For example, in accordance with FIG. 8B and the step S33 of FIG. 12, after patterning the base layer BL, the ligand exchange reaction/process is directly performed on the patterned resist layer PR' including the metal oxide core (e.g. $HfO_2$) and the surrounding organic ligands (e.g. the sulfonic acid and) to replace the oxygen atoms surrounding each of the metal atoms with chloro groups provided by the chlorine-containing compound (e.g. $SiCl_4$) to form the volatile resultants (e.g. $HfCl_4$), thereby the patterned resist layer PR' is removed by sublimation. The disclosure is not limited thereto.

In some embodiments, the pattern forming method illustrated in FIG. 1 to FIG. 10, which involves the resist layer patterning method illustrate in FIG. 11 and the (patterned) resist layer removal method illustrated in FIG. 12, may be adapted in various applications. For example, the pattern forming method involving the resist layer patterning method and the (patterned) resist layer removal method may be adapted to form conductive pillars/vias, seed layers, routing layers, dielectric layers, barrier layers, liner layers, or the like in electronic devices.

In some embodiments, the pattern forming method involving the resist layer patterning method and the (patterned) resist layer removal method may be utilized in forming conductive features and/or dielectric features in a package structure. For example, the conductive patterns and dielectric patterns in an interconnection structure within a semiconductor die/chip of the package or the conductive patterns and dielectric patterns in a redistribution circuit structure of the package may be formed by the pattern forming method involving the resist layer patterning method and the (patterned) resist layer removal method.

Alternatively, the pattern forming method involving the resist layer patterning method and the (patterned) resist layer removal method may also be utilized in forming semiconductor features, conductive features, and/or dielectric features in a field effect transistor (FET). For example, poly gates, metallic gates, gate dielectric layers, spacers, gate contacts of a FET may be formed by the pattern forming method involving the resist layer patterning method and the resist layer removal method.

It should be noted that the elements listed above merely serve as an exemplary illustration, and the disclosure is not limited thereto. The pattern forming method involving the resist layer patterning method and the (patterned) resist layer removal method shown above may also be suitable in forming any other patterns. The adaption of the foregoing pattern forming method involving the resist layer patterning method and the (patterned) resist layer removal method in a package is further exemplified below, but is not limited herein.

FIG. 13 to FIG. 30 are schematic cross-sectional views illustrating intermediate stages of a process of manufacturing a package in accordance with some embodiments of the disclosure. In some embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the disclosure. In FIG. 13 to FIG. 30, one semiconductor die is shown to represent plural semiconductor dies of the wafer, and a package structure 10 is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto.

Referring to FIG. 13, in some embodiments, a carrier C having a de-bonding layer DB and a dielectric layer 100 stacked thereon is provided. In some embodiments, the de-bonding layer DB is formed on the upper surface of the carrier C, and the de-bonding layer DB is between the carrier C and the dielectric layer 100. For example, the carrier C may be a glass substrate and the de-bonding layer DB may be a light-to-heat conversion (LTHC) release layer formed on the glass substrate. However, the disclosure is not limited thereto, and other suitable materials may be adapted for the carrier C and the de-bonding layer DB. In some embodiments, a material of the dielectric layer 100 includes polyimide (PI), epoxy resin, acrylic resin, phenol resin, benzocyclobutene (BCB), polybenzoxazole (PBO), or any other suitable polymer-based dielectric material. The dielectric layer 100, for example, may be formed by suitable fabrication techniques such as spin-on coating, CVD, PECVD, or the like. In some embodiments, the dielectric layer 100 may have adhesion property to adhere the subsequently formed elements.

Referring to FIG. 14, in some embodiments, a plurality of conductive structures 200 and a semiconductor die 300 are formed over the dielectric layer 100. In some embodiments, the semiconductor die 300 is picked and placed onto the dielectric layer 100. The semiconductor die 300, for example, includes a semiconductor substrate 310, a plurality of conductive pads 320, a passivation layer 330, a post passivation layer 340, a plurality of metallic posts 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors, memory, or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a PI layer, a PBO layer, or a dielectric layer formed by other suitable polymers. In addition, the metallic posts 350 are formed on the conductive pads 320. In some embodiments, the metallic posts 350 are plated on the conductive pads 320. The protection layer 360 is formed on the post-passivation layer 340 to cover the metallic posts 350 for providing protection, which avoids the metallic posts 350 of the semiconductor die 300 are damaged during the transportation process or the pick-and-place process.

As illustrated in FIG. 14, the semiconductor die 300 has a rear surface 300a and a front surface 300b opposite to the rear surface 300a. In some embodiments, the rear surface 300a of the semiconductor die 300 is attached (or adhered) to the dielectric layer 100 through a connecting film (not shown). In some embodiments, the connecting film may be, for example, a semiconductor die attach film, a layer made of adhesives or epoxy resin, or the like. On the other hand, the front surface 300b of the semiconductor die 300 faces upward and is exposed. Although one semiconductor die 300 is illustrated in FIG. 14, it construes no limitation in the disclosure. In some alternative embodiments, more than one semiconductor dies 300 may be picked and placed onto the dielectric layer 100.

In some embodiments, the semiconductor die 300 described herein may be referred as a chip or an integrated circuit (IC). In some embodiments, the semiconductor die 300 includes at least one wireless and radio frequency (RF) chip. In some embodiments, the semiconductor die 300 may further include additional chip(s) of the same type or different types. For example, in an alternative embodiment, more than one semiconductor die 300 are provided, and the semiconductor dies 300, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 300 may be referred as a chip or a IC of combination-type, and the semiconductor die 300 may be a WiFi chip simultaneously including both of a RF chip and a digital chip. The disclosure is not limited thereto.

As shown in FIG. 14, for example, the conductive structures 200 are formed to surround the semiconductor die 300. In some embodiments, the method of forming the conductive structures 200 includes the following steps. First, a seed material layer (not shown) is formed over the dielectric layer 100. In some embodiments, the seed material layer includes a titanium/copper composite layer formed by a sputtering process. Subsequently, a photoresist layer (not shown) with openings is formed on the seed material layer through the method illustrated in FIG. 11, so the detailed description thereof is omitted herein. The openings of the photoresist layer expose the intended locations for the subsequently formed conductive structures 200. Thereafter, a plating process is performed to form a metal material layer (e.g., a copper layer) on the seed material layer exposed by the openings of the photoresist layer. The photoresist layer is removed through the method illustrate in FIG. 12, so the detailed description thereof is omitted herein. The underlying seed material layer are then removed to form the conductive structures 200. However, the disclosure is not limited thereto. In some alternative embodiments, the conductive structures 200 may be formed by pick and place pre-fabricated conductive structures onto the dielectric layer 100. In one embodiment, a height of the semiconductor die 300 is higher than a height of the conductive structures 200. However, the disclosure is not limited thereto. In an alternative embodiment, the height of the semiconductor die 300 may be less than or substantially equal to the height of the conductive structures 200.

Referring to FIG. 15, in some embodiments, an encapsulation material 400' is formed on the dielectric layer 100 to encapsulate the conductive structures 200 and the semiconductor die 300. The conductive structures 200 and the protection layer 360 of the semiconductor die 300 are encapsulated by the encapsulation material 400'. In other words, the conductive structures 200 and the protection layer 360 of the semiconductor die 300 are not accessibly revealed and are well-protected by the encapsulation material 400'. In some embodiments, the encapsulation material 400' is a molding compound, a molding underfill, a resin (such as epoxy), or the like. The encapsulation material 400' may be formed by a molding process, such as a compression molding process. In some embodiments, the encapsulation material 400' may further include inorganic filler or inorganic compound (e.g. silica, clay, and so on) which can be added therein to optimize coefficient of thermal expansion (CTE) of the encapsulation material 400'. The disclosure is not limited thereto.

Referring to FIG. 15 and FIG. 16, in some embodiments, the encapsulation material 400' and the protection layer 360 of the semiconductor die 300 are planarized until top surfaces of the metallic posts 350 are exposed. After the encapsulation material 400' is planarized, an encapsulant 400 is formed over the dielectric layer 100 to encapsulate the semiconductor die 300 and the conductive structures 200. In some embodiments, the encapsulation material 400' is planarized by a mechanical grinding process and/or a chemical mechanical polishing (CMP) process. In some embodiments, during the planarizing process of the encapsulation material 400', the protection layer 360 is planarized to accessibly reveal the metallic posts 350. In some embodiments, portions of the metallic posts 350 and portions of the conductive structures 200 are slightly planarized as well.

After planarizing, the semiconductor die 300 has an active surface 300c and a rear surface 300a opposite to the active surface 300c, as shown in FIG. 16, for example. The exposed portion of the metallic posts 350 is located on the active surface 300c of the semiconductor die 300. The encapsulant 400 encapsulates sidewalls of the semiconductor die 300, and the encapsulant 400 is penetrated by the conductive structures 200. In other words, the semiconductor die 300 and the conductive structures 200 are embedded in the encapsulant 400. It is noted that top surfaces of the conductive structures 200, a top surface of the protection layer 360, and the top surfaces of the metallic posts 350 are substantially coplanar to a top surface of the encapsulant 400. In other words, the top surfaces of the conductive structures 200, the top surface of the protection layer 360, and the top surfaces of the metallic posts 350 are substantially levelled with the top surface of the encapsulant 400. In some embodiments, after the planarizing process, a cleaning step may be optionally performed to clean and remove the residue generated from the planarizing process.

Referring to FIG. 17, in some embodiments, a seed material layer SL is formed over the encapsulant 400. The seed material layer SL may be formed through, for example, a sputtering process, a PVD process, or the like. In some embodiments, the seed material layer SL may include, for example, copper, titanium-copper alloy, or other suitable choice of materials. In some embodiments, the seed material layer SL is conformally formed to be in direct contact with the encapsulant 400, the metallic posts 350 and the protection layer 360 of the semiconductor die 300, and the conductive structures 200. Thereafter, a photoresist layer PR1 is formed over the seed material layer SL, where the photoresist layer PR1 is formed through the steps S12 to S13 of the method illustrated in FIG. 10 and the method illustrated in FIG. 11, so the detailed description thereof is omitted herein. As illustrated in FIG. 17, the photoresist layer PR1 has a pattern with a plurality of openings OP1 exposing at least a portion of the seed material layer SL. In some embodiments, the openings OP1 correspond to the locations of the metallic posts 350 and the conductive structures 200.

Referring to FIG. 17 and FIG. 18, in some embodiments, a plurality of conductive patterns 512a are formed on the seed material layer SL. In some embodiments, a conductive material (not shown) is filled into the openings OP1 formed in the photoresist layer PR1. Thereafter, the photoresist layer PR1 is removed to obtain the conductive patterns 512a. In some embodiment, the photoresist layer PR1 is removed by the step S15 of the method illustrated in FIG. 10 and the method illustrated in FIG. 12, so the detailed description thereof is omitted herein. Upon removal of the photoresist layer PR1, portions of the seed material layer SL, which are not covered by the conductive patterns 512a, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like.

Figure 19:
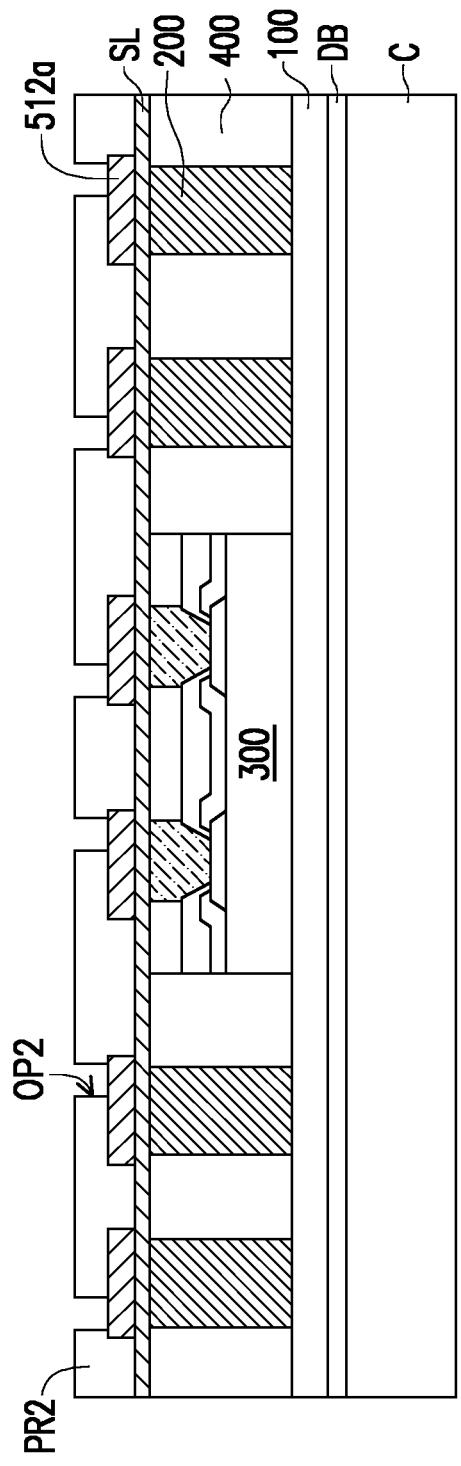

Referring to FIG. 19, in some embodiments, a photoresist layer PR2 is formed over the seed material layer SL and the conductive patterns 512a. In some embodiments, the photoresist layer PR2 may be formed through the steps S12 to S13 of the method illustrated in FIG. 10 and the method illustrated in FIG. 11, so the detailed description thereof is omitted herein. As illustrated in FIG. 19, the photoresist layer PR2 has a pattern with a plurality of openings OP2 exposing at least a portion of the conductive patterns 512a.

Figure 20:
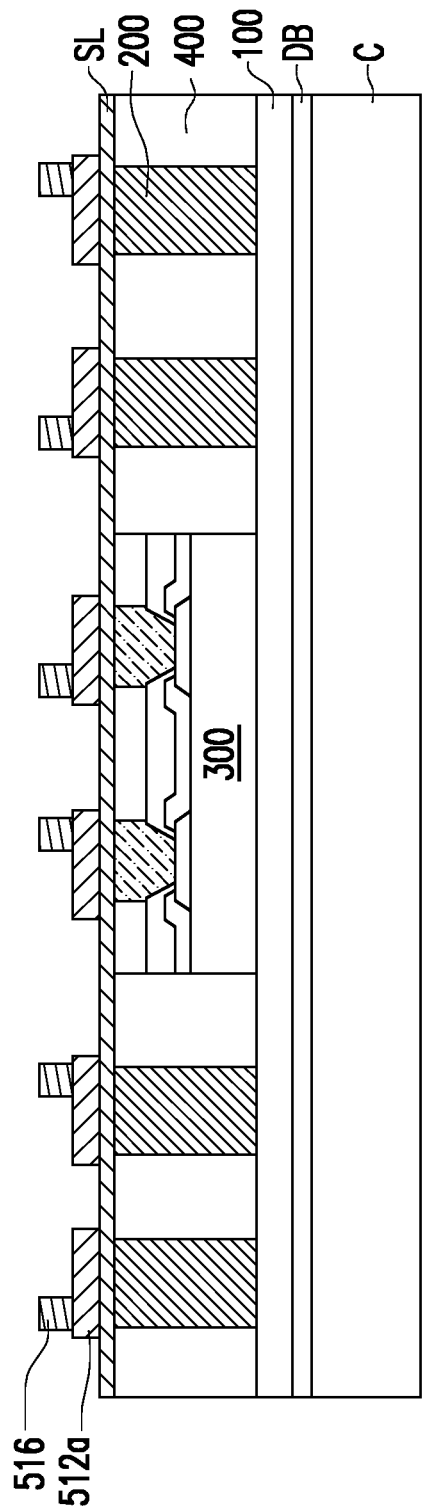

Referring to FIG. 19 and FIG. 20, in some embodiments, a plurality of conductive patterns 516 are formed on the conductive patterns 512a. In some embodiments, a conductive material (not shown) is filled into the openings OP2 formed in the photoresist layer PR2. Thereafter, the photoresist layer PR2 is removed to obtain the conductive patterns 516. In some embodiment, the photoresist layer PR2 is removed by the step S15 of the method illustrated in FIG. 10 and the method illustrated in FIG. 12, so the detailed description thereof is omitted herein. In some embodiments, the conductive material may be formed by a plating process. The plating process is, for example, electro-plating, electroless-plating, immersion plating, or the like. In some embodiments, the conductive material includes, for example, copper, copper alloys, or the like. In some embodiments, the plating process of the conductive patterns 516 shares the same seed layer with the plating process of the conductive patterns 512a. That is, the seed material layer SL may be utilized as a seed layer for plating for both of the conductive patterns 516 and the conductive patterns 512a.

Figure 21:
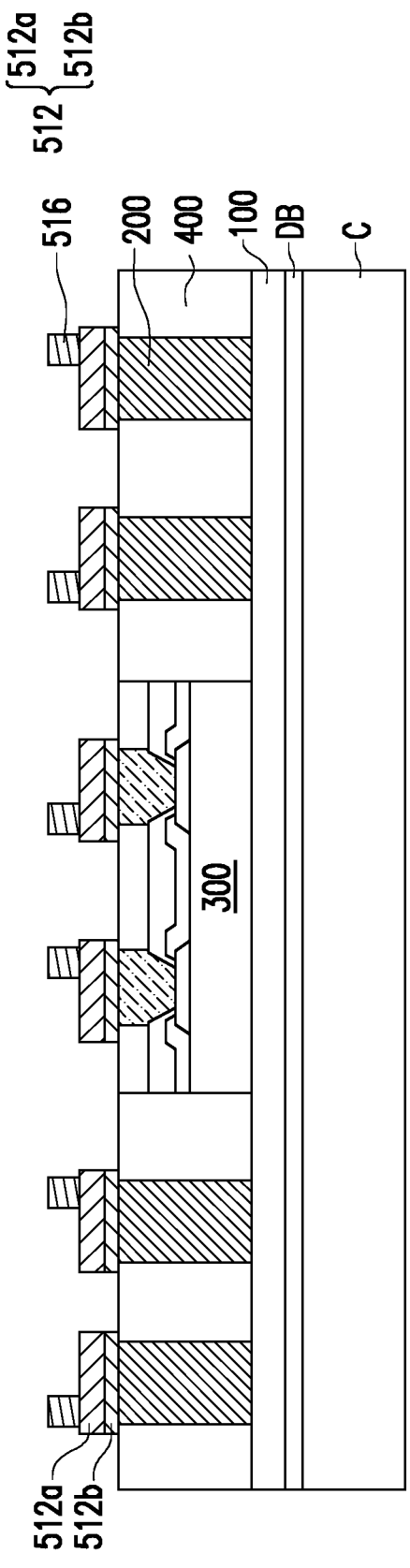

Referring to FIG. 20 and FIG. 21, in some embodiments, the seed material layer SL that is not covered by the conductive patterns 512a is removed to form seed layer patterns 512b. The exposed portions of the seed material layer SL may be removed through an etching process. In some embodiments, the conductive patterns 512a and the seed layer patterns 512b may be collectively referred to as conductive patterns 512. In some embodiments, the conductive patterns 512 may be referred to as first routing patterns while the conductive patterns 516 may be referred to as conductive vias.

Figure 22:
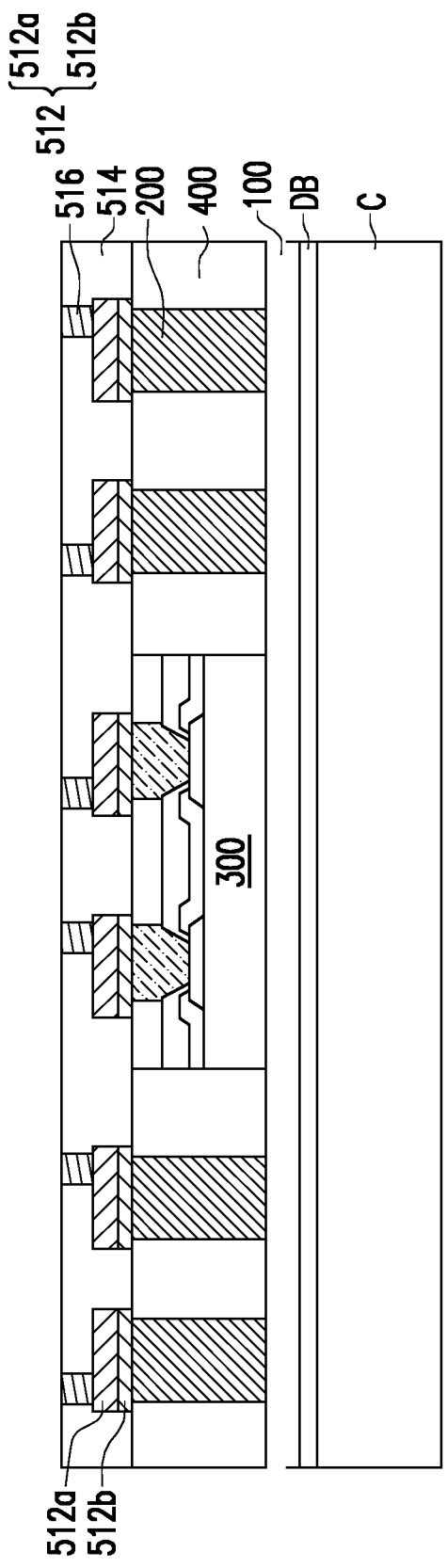

Referring to FIG. 22, in some embodiments, a dielectric layer 514 is formed on the encapsulant 400 and the semiconductor die 300 to encapsulate the conductive patterns 512 and the conductive patterns 516. In some embodiments, the dielectric layer 514 may be formed by suitable fabrication techniques, such as spin-on coating, CVD, PECVD, or the like. In some embodiments, the conductive patterns 512, the conductive patterns 516, and the dielectric layer 514 may be collectively referred to as a first sub-layer. The number of the first sub-layer may be one or more than one, the disclosure is not limited thereto. The number of the first sub-layer may be designated based on the design layout and the demand.

Figure 23:
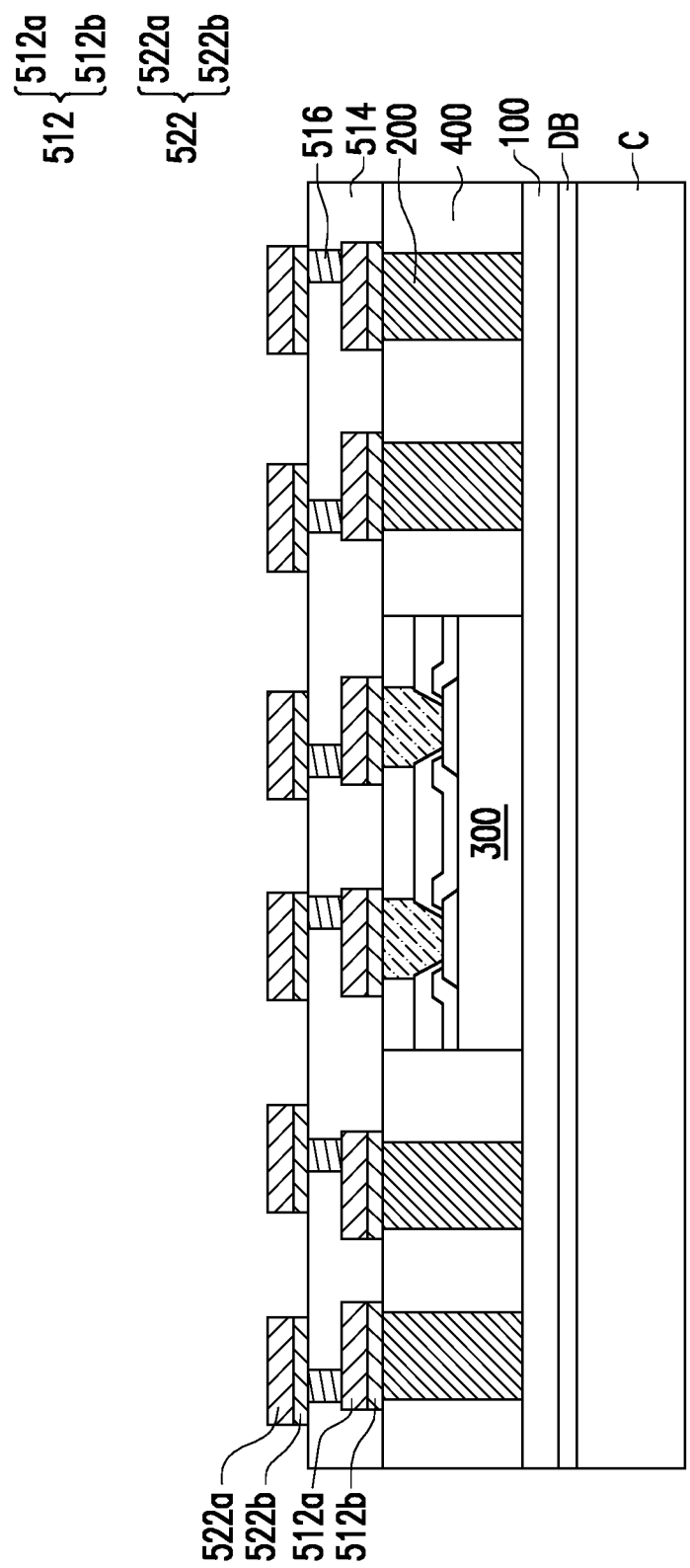

Referring to FIG. 23, in some embodiments, a plurality of conductive patterns 522a and a plurality of seed layer patterns 522b are formed on the first sub-layer. In some embodiments, the material and the formation method of the conductive patterns 522a and the seed layer patterns 522b may be respectively similar to the conductive pattern 512a and the seed layer patterns 512b, so the detailed descriptions thereof are omitted herein. In some embodiments, the conductive patterns 522a and the seed layer patterns 522b may be collectively referred to as conductive patterns 522. As illustrated in FIG. 23, the conductive patterns 522 are formed to be directly in contact with the conductive patterns 516. In some embodiments, the conductive patterns 522 may be referred to as second routing patterns.

Figure 24:
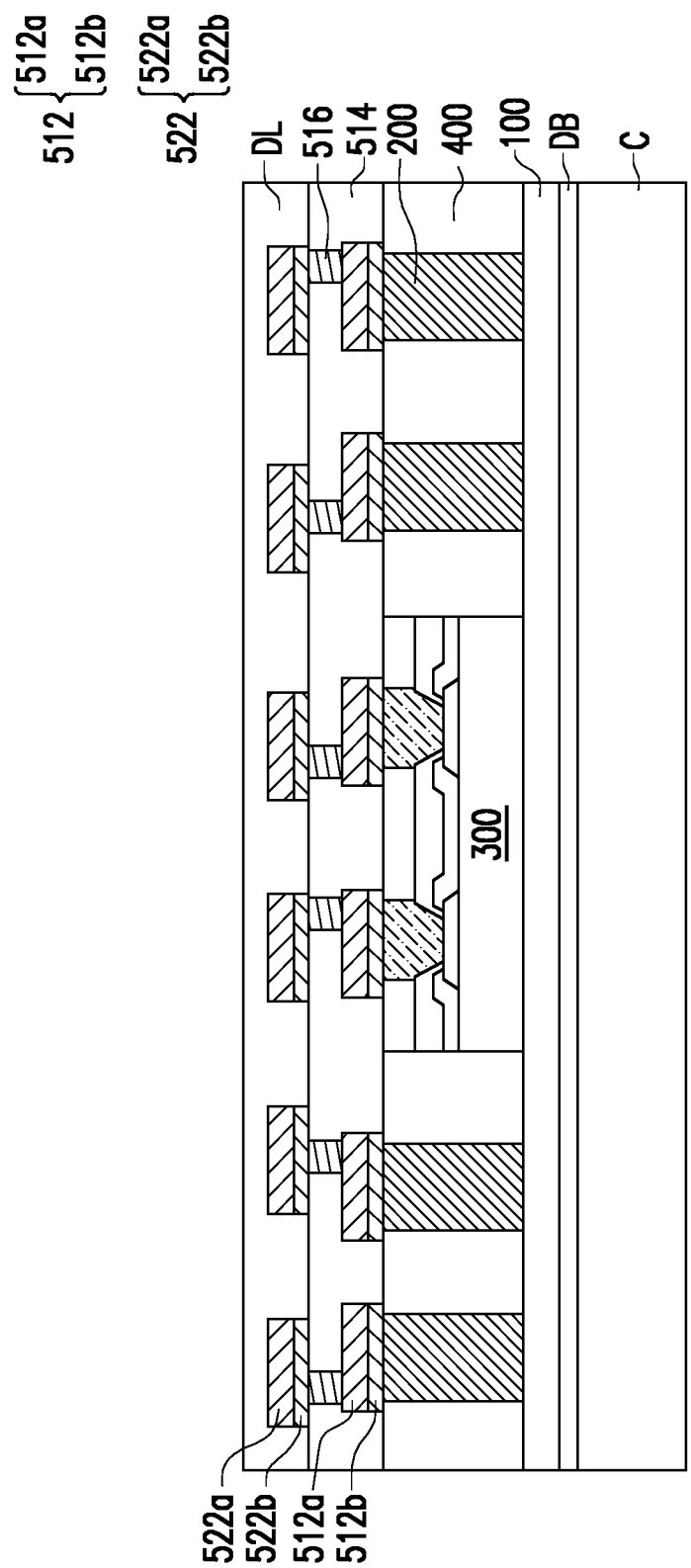

Referring to FIG. 24, in some embodiments, a dielectric layer DL is formed over the first sub-layer and the conductive patterns 522. For example, the dielectric layer DL is stacked on the dielectric layer 514. In some embodiments, a material of the dielectric layer DL includes polyimide, epoxy resin, acrylic resin, phenol resin, BCB, PBO, or any other suitable polymer-based dielectric material. The material of the dielectric layer DL may be the same as the material of the dielectric layer 514, in one embodiment. The material of the dielectric layer DL may be different from the material of the dielectric layer 514, in an alternative embodiment. The dielectric layer DL may be formed by the step S11 of the method illustrated in FIG. 10, so the detailed description thereof is omitted herein.

Figure 25:
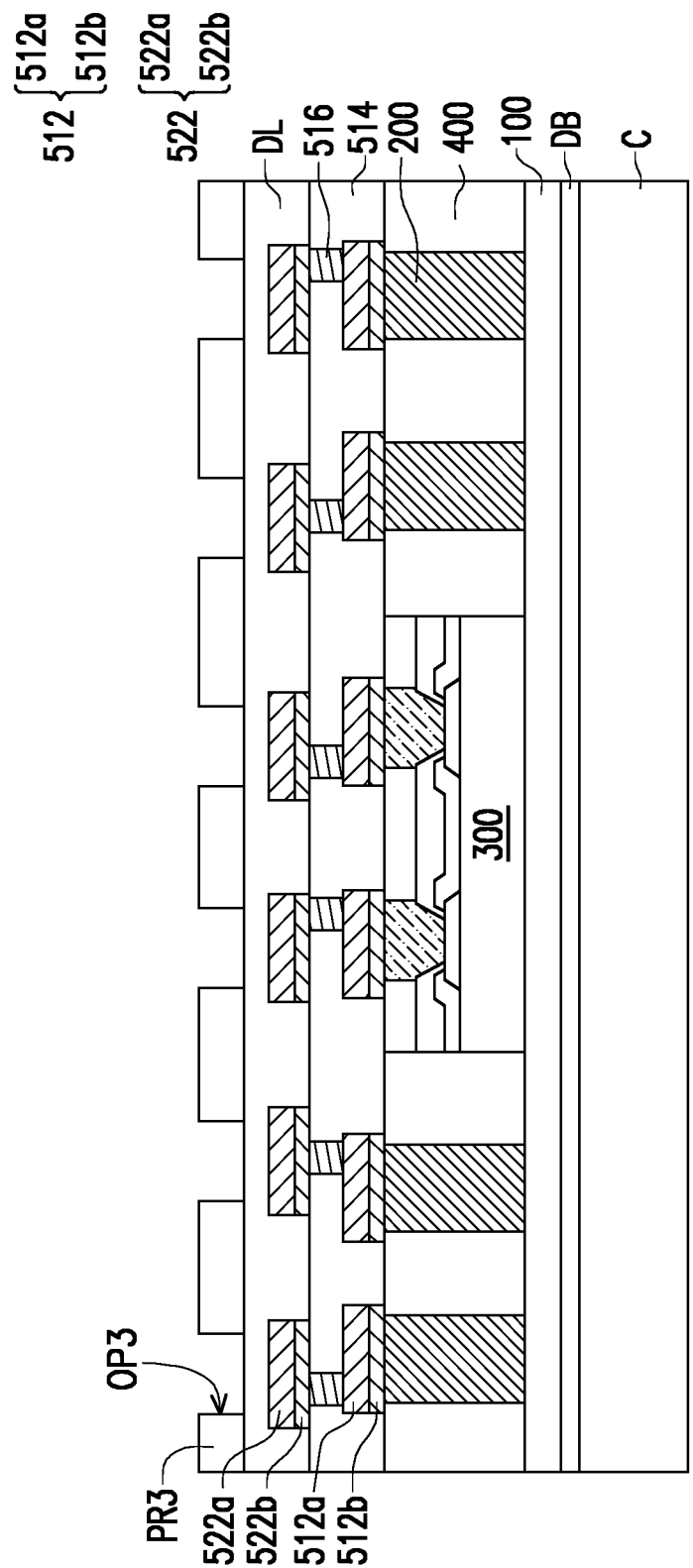

Referring to FIG. 25, in some embodiments, a photoresist layer PR3 is formed over the dielectric layer DL. In some embodiments, the photoresist layer PR3 may be formed through the steps S12 to S13 of the method illustrated in FIG. 10 and the method illustrated in FIG. 11, so the detailed description thereof is omitted herein. As illustrated in FIG. 25, the photoresist layer PR3 has a pattern with a plurality of openings OP3 exposing at least a portion of the dielectric layer DL.

Figure 26:
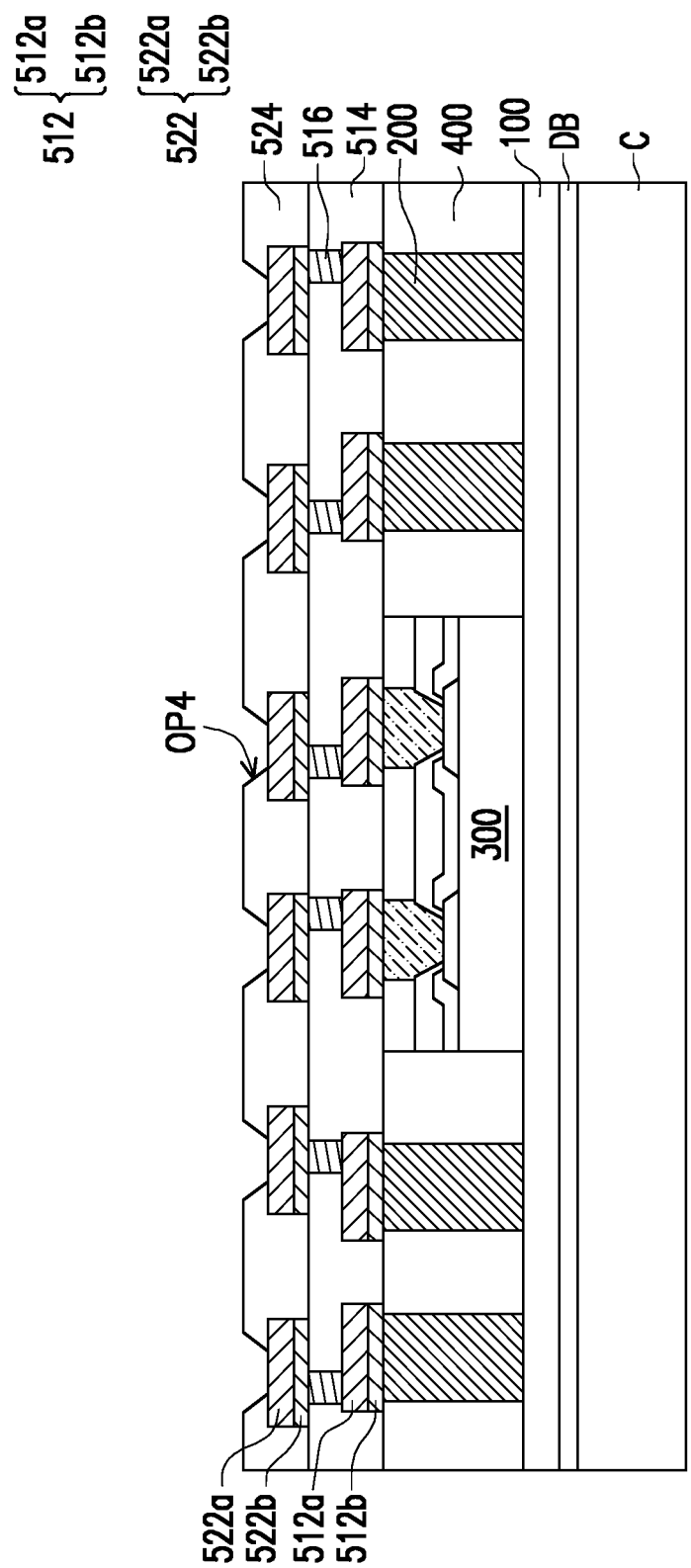

Referring to FIG. 25 and FIG. 26, in some embodiments, the dielectric layer DL is patterned to form a dielectric layer 524, and the photoresist layer PR3 is then removed. In some embodiment, the dielectric layer 524 may be formed through the step S14 of the method illustrated in FIG. 10, so the detailed description thereof is omitted herein. In some embodiment, the photoresist layer PR3 is removed by the step S15 of the method illustrated in FIG. 10 and the method illustrated in FIG. 12, so the detailed description thereof is omitted herein. For example, the dielectric layer 524 has a plurality of openings OP4. In some embodiments, the openings OP4 formed in the dielectric layer 524 partially exposes the conductive patterns 522.

Figure 27:
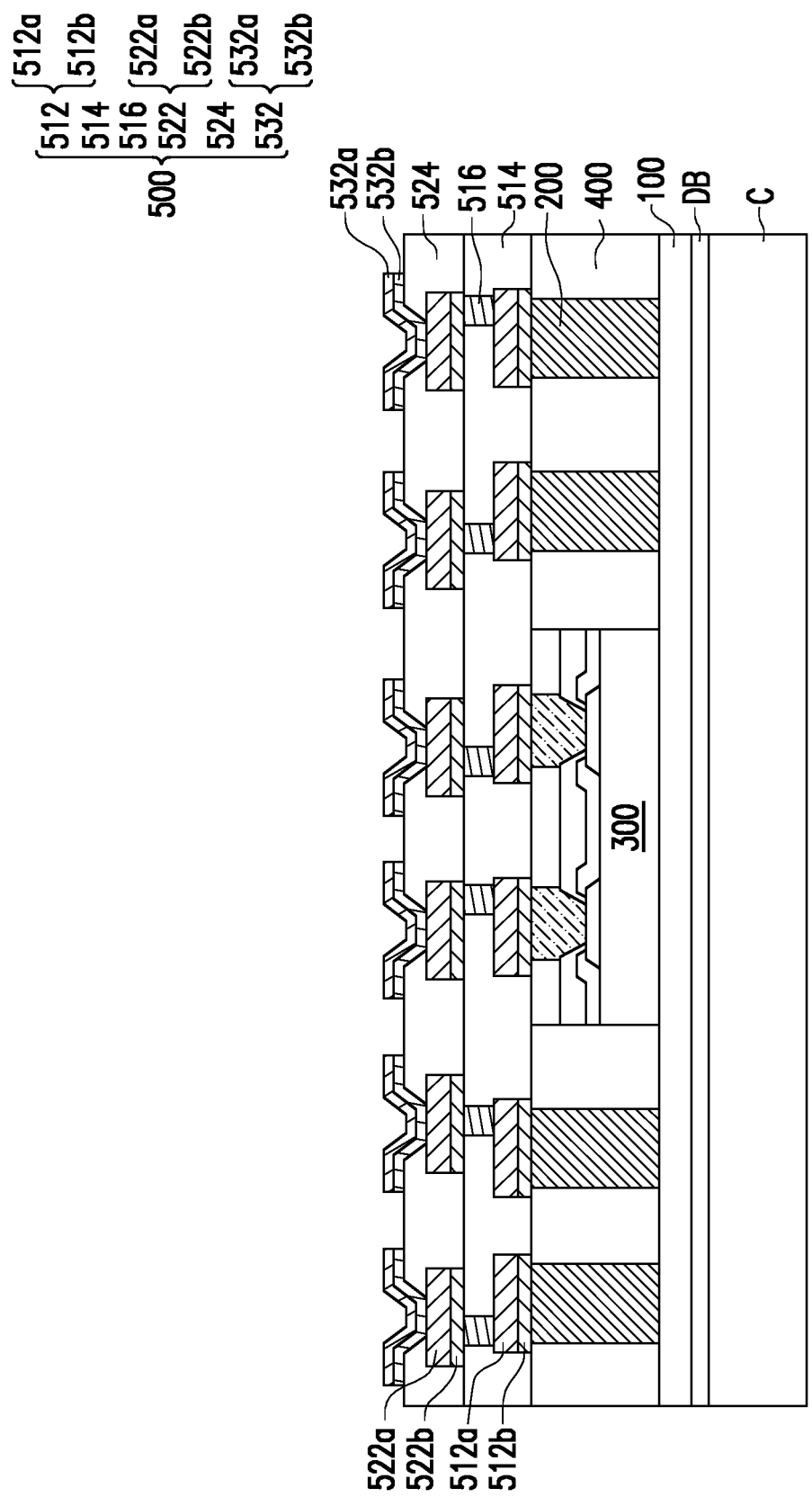

Referring to FIG. 27, in some embodiments, a plurality of conductive patterns 532 are formed on the conductive patterns 522 to obtain a redistribution circuit structure 500. In some embodiments, the conductive patterns 532 include a plurality of seed layer patterns 532b and a plurality of conductive patterns 532a. In some embodiments, the conductive patterns 532 may be formed by the following steps. First, a seed material layer (not shown) extending into the openings OP4 may be formed over the dielectric layer 524. The seed material layer may be formed through, for example, a sputtering process, a PVD process, or the like. In some embodiments, the seed material layer may include, for example, copper, titanium-copper alloy, or other suitable choice of materials. A photoresist pattern/layer (not shown) may then be formed on the seed material layer through the method illustrated in FIG. 11, so the detailed description thereof is omitted herein. The photoresist pattern/layer has openings exposing the seed material layer located inside of the openings OP4. In some embodiments, the openings of the photoresist pattern/layer also expose portions of the seed material layer in proximity of the openings OP4. Thereafter, a conductive material (not shown) is filled into the openings formed in the photoresist pattern/layer and the openings OP4 formed in the dielectric layer 524 by electroplating or deposition. Then, the photoresist pattern/layer and the seed material layer underneath the photoresist pattern/layer are removed to obtain the conductive patterns 532. For example, the photoresist pattern/layer is removed through the method illustrate in FIG. 12, so the detailed description thereof is omitted herein. In some embodiments, the seed material layer is removed by an etching process such as a wet etching, a dry etching, and a combination thereof.

In some embodiments, the conductive patterns 532 may be referred to as under-ball metallurgy (UBM) patterns. In some embodiments, the conductive patterns 522, the conductive patterns 532, and the dielectric layer 524 may be collective referred to as a second sub-layer. In some embodiments, the redistribution circuit structure 500 is constituted by the first sub-layer and the second sub-layer. It should be noted that although the redistribution circuit structure 500 is illustrated to have two sub-layers in FIG. 27, the disclosure is not limited thereto. In some alternative embodiments, the redistribution circuit structure 500 may be constituted by more or less layers of sub-layers depending on the circuit design and may be adjusted by controlling the number of the first sub-layer. In some embodiments, the redistribution circuit structure 500 may be referred to as ultra-high density (UHD) redistribution circuit structure. As shown in FIG. 27, In some embodiments, the redistribution circuit structure 500 is electrically connected to the conductive structures 200 and the semiconductor die 300. For example, the conductive structures 200 is electrically connected to the semiconductor die 300 through the redistribution circuit structure 500.

Figure 28:
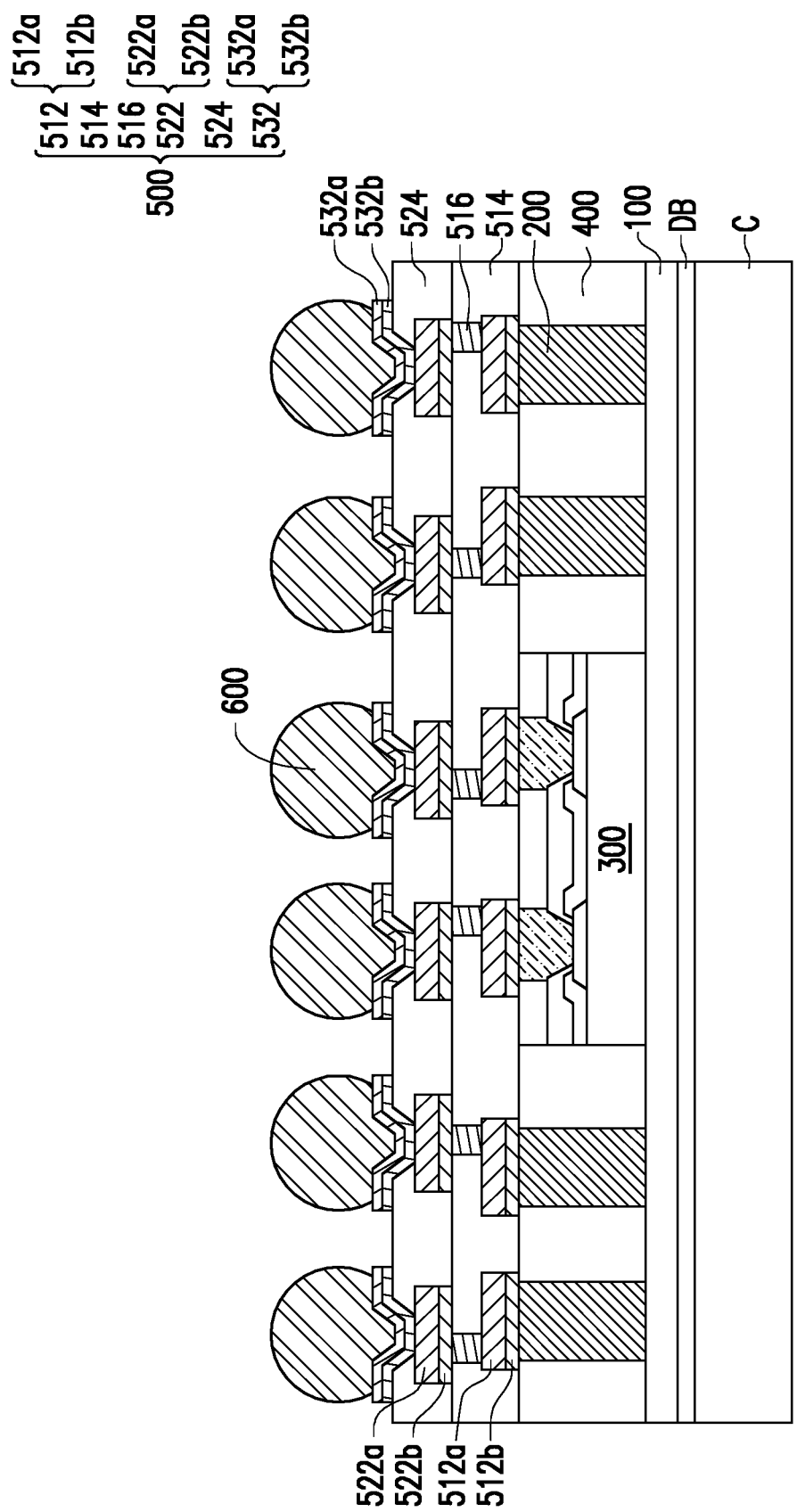

Referring to FIG. 28, in some embodiments, after the redistribution circuit structure 500 is formed, a plurality of conductive terminals 600 are placed on the conductive patterns 532 (e.g. the UBM patterns) of the redistribution circuit structure 500. In some embodiments, the conductive terminals 600 are electrically connected to the redistribution circuit structure 500. In some embodiments, the conductive terminals 600 include solder balls or ball grid array (BGA) balls. In some embodiments, the conductive terminals 600 may be placed on the UBM patterns through a ball placement process or reflow process. The number of the conductive terminals 600 is not limited to the disclosure, and is adjustable by controlling the numbers of the openings OP4 and the conductive patterns 532 based on the design layout and the demand.

Figure 29:
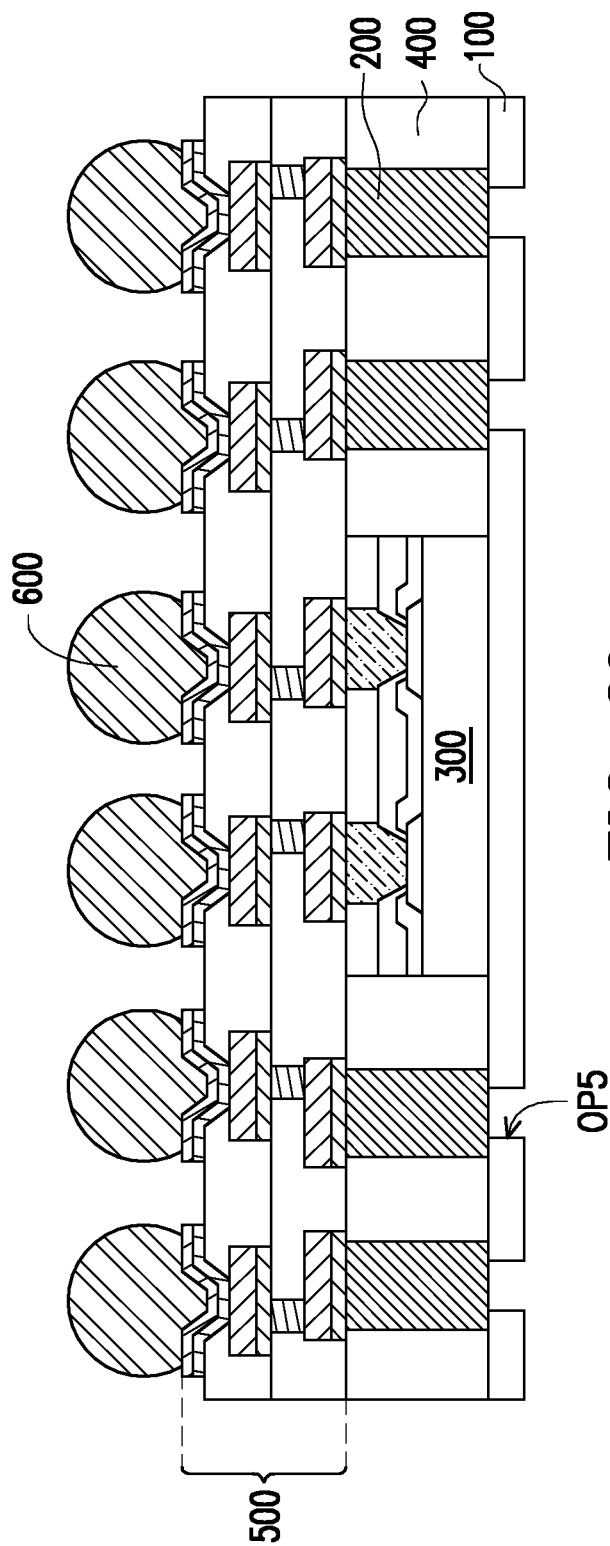

Referring to FIG. 29, in some embodiments, the dielectric layer 100 formed on the bottom surface of the encapsulant 400 is de-bonded from the de-bonding layer DB such that the dielectric layer 100 is separated from the carrier C. That is, the carrier C is removed. In some embodiments, the de-bonding layer DB (e.g., the LTHC release layer) may be irradiated by an UV laser such that the dielectric layer 100 is peeled off from the carrier C. As illustrated in FIG. 29, the dielectric layer 100 is then patterned such that a plurality of openings OP5 are formed in the dielectric layer 100 to partially expose the conductive structures 200. In some embodiments, the openings OP5 formed in the dielectric layer 100 are formed by a laser drilling process, a mechanical drilling process, or other suitable processes.

Figure 30:
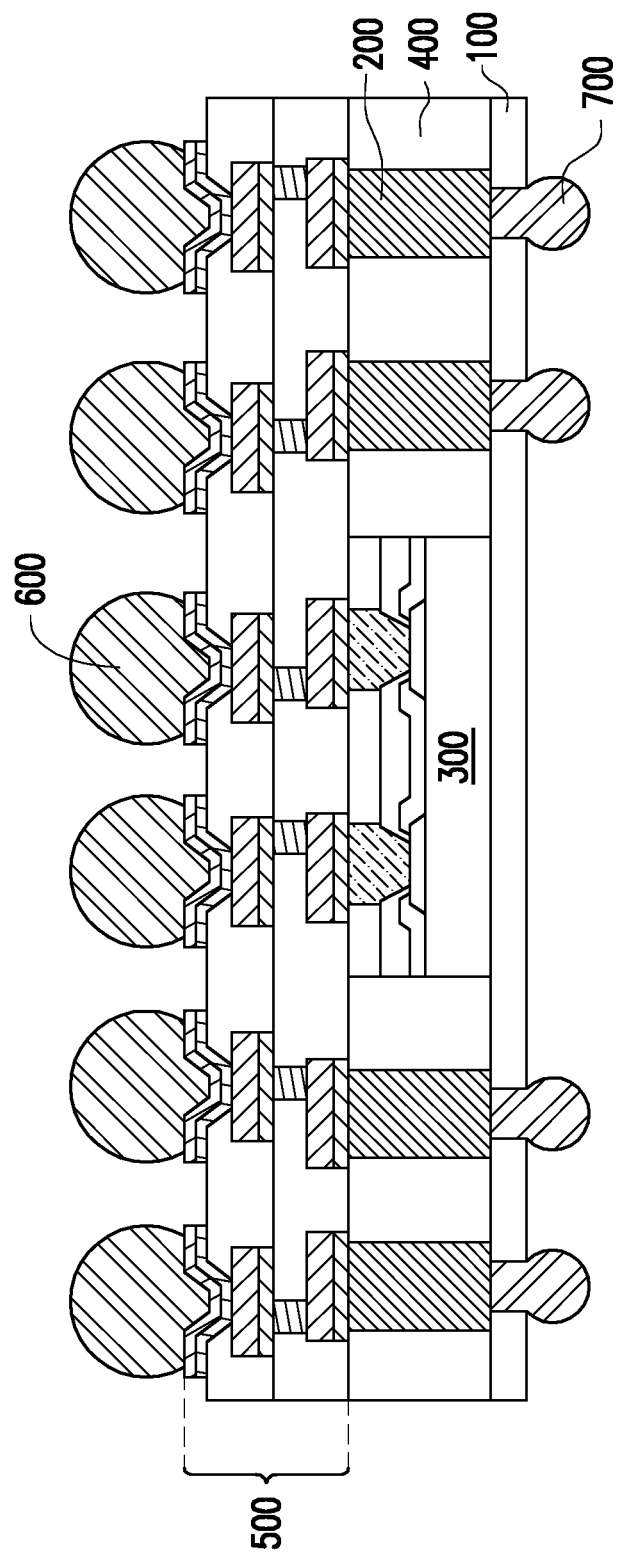

Referring to FIG. 29 and FIG. 30, in some embodiments, after the openings OP5 are formed in the dielectric layer 100, a plurality of conductive terminals 700 are respectively formed on bottom surfaces of the conductive structures 200 that are exposed by the openings OP5. And, the conductive terminals 700 may be, for example, reflowed to bond with the bottom surfaces of the conductive structures 200. As shown in FIG. 30, after the conductive terminals 600 and the conductive terminals 700 are formed, a formation of the package 10 having dual-side terminals is accomplished. In the disclosure, the package 10 may be referred to as an integrated fan-out (InFO) package.

Before forming the conductive terminals 700, a holding device (not shown) is adopted to secure the package 10, where the conductive terminals 600 are held by the holding device. For example, the holding device may be an adhesive tape, a carrier film or a suction pad. After the formation of the conductive terminals 700, the conductive terminals 600 are released from the holding device to form the package 10. In some embodiments, prior to releasing the conductive terminals 600 from the holding device, a dicing process is performed to cut the packages 10 inter-connected to each other into individual and separated packages 10. In one embodiment, the dicing process is a wafer dicing process including mechanical blade sawing or laser cutting.

In some embodiments, through the redistribution circuit structure 500, some of the conductive terminals 600 are electrically connected to the semiconductor die 300. In some embodiments, through the redistribution circuit structure 500 and the conductive structures 200, some of the conductive terminals 700 are electrically connected to the semiconductor die 300. In some embodiments, through the redistribution circuit structure 500 and the conductive structures 200, some of the conductive terminals 700 are electrically connected to some of the conductive terminals 600. In certain embodiments, some of the conductive terminals 600 and/or some of the conductive terminals 700 may be electrically floated or grounded, the disclosure is not limited thereto.

In an alternative embodiment, an additional (semiconductor) package (not shown) may be provided. In some embodiments, the additional (semiconductor) package, for example, may include a memory device, the disclosure is not limited thereto. In other embodiments, the additional (semiconductor) package, for example, may include an organic substrate or a printed circuit board (PCB). In certain embodiments, the additional (semiconductor) package may be stacked over and electrically connected to the package 10 depicted in FIG. 30 through the conductive terminals 600 and/or the conductive terminals 700, such that a package-on-package (POP) structure is fabricated.

In accordance with some embodiments of the disclosure, a method for removing a resist layer includes at least the following steps. A resist layer is formed with a material comprising a metal oxide core with organic ligands. A chlorine-containing compound or a methyl group-containing compound is globally applied onto the resist layer to allow the chlorine-containing compound or the methyl group-containing compound to perform a ligand exchange process with the resist layer so as to remove the resist layer through sublimation.

In accordance with some embodiments of the disclosure, a method for forming a pattern includes at least the following steps. A resist layer is formed over a base layer. The resist layer is patterned to form a patterned resist layer with openings exposing portions of the base layer, and a material of the patterned resist layer includes a metal oxide core with organic ligands. The base layer is patterned by using the patterned resist layer as a mask to form a pattern. The patterned resist layer is removed, wherein removing the patterned resist layer includes globally applying a chlorine-containing compound or a methyl group-containing compound onto the patterned resist layer to allow the chlorine-containing compound or the methyl group-containing compound to perform a ligand exchange process with the patterned resist layer so as to remove the patterned resist layer through sublimation.

In accordance with some embodiments of the disclosure, a manufacturing method of a package includes at least the following steps. A semiconductor die is provided, wherein the semiconductor die includes a plurality of metallic posts. The semiconductor die is encapsulated by an insulating encapsulant. A redistribution circuit structure is formed over the semiconductor die and the insulating encapsulant, and forming the redistribution circuit structure includes forming a resist layer with a pattern having openings over the insulating encapsulant, a material of the resist layer comprising a metal oxide core with organic ligands; forming a metallization layer corresponding to the resist layer over the insulating encapsulant and electrically connected to the plurality of metallic posts; and globally applying a chlorine-containing compound or a methyl group-containing compound onto the resist layer to allow the chlorine-containing compound or the methyl group-containing compound to perform a ligand exchange process with the resist layer so as to remove the resist layer through sublimation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing a resist layer, comprising:
forming a resist layer with a material comprising a metal oxide core with organic ligands;
performing a ligand removal process to remove the organic ligands; and
globally applying a chlorine-containing compound in gas phase or a methyl group-containing compound in gas phase onto the resist layer through a spray process to allow the chlorine-containing compound or the methyl group-containing compound to perform a ligand exchange process with the resist layer so as to remove the resist layer through sublimation.

2. The method of claim 1, wherein the metal oxide core comprises hafnium oxide, titanium oxide, tin oxide, or zirconium oxide, and wherein a ratio of an atomic percentage of the organic ligands to an atomic percentage of the metal oxide core being in a range of 10% to 50%.

3. The method of claim 1, wherein the organic ligands comprise a benzoic acid or a sulfonic acid.

4. The method of claim 3, wherein the organic ligands further comprise a methacrylic acid.

5. The method of claim 1, wherein performing the ligand removal process comprises performing an ozone plasma process, an oxygen plasma process, or a remote oxygen plasma process.

6. The method of claim 1,
wherein the chlorine-containing compound comprises tetrachlorosilane, or
wherein the methyl group-containing compound comprises trimethylaluminum or dimethylacetamide.

7. The method of claim 1, wherein performing the ligand exchange process comprises replacing oxygen atoms surrounding a metal atom comprised in the metal oxide core with chloro-groups provided by the chlorine-containing compound or methyl-groups provided by the methyl group-containing compound to turn resultants thereof into volatiles.

8. The method of claim 1, wherein prior to globally applying the chlorine-containing compound or the methyl group-containing compound onto the resist layer and after performing the ligand removal process, the method further comprises:
performing a fluorination process to react the metal oxide core with a fluorine-containing compound to form a metal fluoride core.

9. The method of claim 8, wherein performing the ligand exchange process comprises replacing fluorine atoms surrounding a metal atom comprised in the metal fluoride core with chloro-groups provided by the chlorine-containing compound or methyl-groups provided by the methyl group-containing compound to turn resultants thereof into volatiles.

10. The method of claim 8, wherein the fluorine-containing compound comprises a hydrofluoric acid.

11. A method of forming a pattern, comprising:
forming a patterned resist layer with a material comprising a metal oxide core with organic ligands;
patterning a base layer by using the patterned resist layer as an etching mask; and
removing the patterned resist layer, wherein removing the patterned resist layer comprises:
performing a ligand removal process to remove the organic ligands; and
after performing the ligand removal process, globally applying a chlorine-containing compound or a methyl group-containing compound onto the patterned resist layer to allow the chlorine-containing compound or the methyl group-containing compound to perform a ligand exchange process with the patterned resist layer so as to remove the patterned resist layer through sublimation.

12. The method of claim 11, wherein the base layer comprises a conductive layer, a semiconductor layer, or an insulating layer.

13. The method of claim 11, wherein forming the patterned resist layer comprises:
forming a resist layer over the base layer;
providing a photomask over the resist layer;
globally irradiating the resist layer with an electromagnetic radiation through the photomask to allow parts of the resist layer to be exposed portions to the electromagnetic radiation and rest of the resist layer to be unexposed portions to the electromagnetic radiation, wherein the electromagnetic radiation comprises an extreme ultraviolet exposure; and
removing either the exposed portions or the unexposed portions of the resist layer through a developer to form the patterned resist layer with the openings exposing portions of the base layer.

14. The method of claim 11, wherein performing the ligand exchange process comprises replacing oxygen atoms surrounding a metal atom comprised in the metal oxide core with chloro-groups provided by the chlorine-containing compound or methyl-groups provided by the methyl group-containing compound to turn resultants thereof into volatiles.

15. The method of claim 11, wherein prior to globally applying the chlorine-containing compound or the methyl group-containing compound onto the patterned resist layer and after performing the ligand removal process, the method further comprises:
performing a fluorination process to react the metal oxide core with a fluorine-containing compound to form a metal fluoride core.

16. The method of claim 15, wherein performing the ligand exchange process comprises replacing fluorine atoms surrounding a metal atom comprised in the metal fluoride core with chloro-groups provided by the chlorine-containing compound or methyl-groups provided by the methyl group-containing compound to turn resultants thereof into volatiles.

17. A method of manufacturing a package, comprising:
providing a semiconductor die comprising a plurality of vias;
encapsulating the semiconductor die in an insulating encapsulant; and
forming a redistribution circuit structure over the insulating encapsulant, and the redistribution circuit structure being electrically coupled to the semiconductor die through the plurality of vias, comprising:

forming a patterned resist layer with a material comprising a metal oxide core with organic ligands over the insulating encapsulant;

forming a metallization layer in the patterned resist layer over the insulating encapsulant and connected to the plurality of vias;

performing a ligand removal process to remove the organic ligands; and globally applying a chlorine-containing compound in gas phase or a methyl group-containing compound in gas phase onto the patterned resist layer through a spray process to allow the chlorine-containing compound or the methyl group-containing compound to perform a ligand exchange process with the patterned resist layer so as to remove the patterned resist layer through sublimation.

18. The method of claim 17, wherein performing the ligand exchange process comprises replacing oxygen atoms surrounding a metal atom comprised in the metal oxide core with chloro-groups provided by the chlorine-containing compound or methyl-groups provided by the methyl group-containing compound to turn resultants thereof into volatiles.

19. The method of claim 17, wherein prior to globally applying the chlorine-containing compound or the methyl group-containing compound onto the patterned resist layer and after performing the ligand removal process, the method further comprises:

performing a fluorination process to react the metal oxide core with a fluorine-containing compound to form a metal fluoride core.

20. The method of claim 19, wherein performing the ligand exchange process comprises replacing fluorine atoms surrounding a metal atom comprised in the metal fluoride core with chloro-groups provided by the chlorine-containing compound or methyl-groups provided by the methyl group-containing compound to turn resultants thereof into volatiles.

* * * * *